(12) United States Patent
Shim et al.

(10) Patent No.: US 9,711,517 B2
(45) Date of Patent: Jul. 18, 2017

(54) MEMORY DEVICE HAVING A PIPE TRANSISTOR AND SUB-PIPE GATE MATERIALS WITH DIFFERENT OXIDATION RATES

(71) Applicant: SK hynix Inc., Gyeonggi-do (KR)

(72) Inventors: Keon Soo Shim, Gyeonggi-do (KR); Seul Ki Oh, Gyeonggi-do (KR); Eun Seok Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/076,777

(22) Filed: Mar. 22, 2016

(65) Prior Publication Data

US 2017/0110468 A1 Apr. 20, 2017

(30) Foreign Application Priority Data

Oct. 15, 2015 (KR) ........................ 10-2015-0144163

(51) Int. Cl.
*H01L 27/11568* (2017.01)
*H01L 27/11582* (2017.01)
*H01L 21/28* (2006.01)

(52) U.S. Cl.
CPC .. *H01L 27/11568* (2013.01); *H01L 21/28282* (2013.01); *H01L 27/11582* (2013.01)

(58) Field of Classification Search
None
See application file for complete search history.

(56) References Cited

U.S. PATENT DOCUMENTS

| | | | | |
|---|---|---|---|---|
| 9,099,348 B2* | 8/2015 | Lee | ................... | H01L 27/11573 |
| 2012/0273865 A1* | 11/2012 | Lee | ................... | H01L 27/11582 |
| | | | | 257/316 |
| 2012/0273867 A1* | 11/2012 | Ko | ...................... | H01L 29/7926 |
| | | | | 257/324 |
| 2013/0148398 A1* | 6/2013 | Baek | ................. | H01L 27/11582 |
| | | | | 365/51 |
| 2013/0153983 A1* | 6/2013 | Jeon | .................. | H01L 29/66833 |
| | | | | 257/324 |
| 2013/0234234 A1* | 9/2013 | Yoo | ................... | H01L 29/66833 |
| | | | | 257/324 |
| 2013/0237025 A1* | 9/2013 | Yang | ................ | H01L 27/11582 |
| | | | | 438/268 |
| 2014/0151627 A1* | 6/2014 | Hong | ................... | H01L 45/122 |
| | | | | 257/4 |

FOREIGN PATENT DOCUMENTS

| | | |
|---|---|---|
| KR | 1020130070158 | 6/2013 |
| KR | 1020170002080 | 1/2017 |

* cited by examiner

*Primary Examiner* — Marc Armand
*Assistant Examiner* — Younes Boulghassoul
(74) *Attorney, Agent, or Firm* — IP & T Group LLP

(57) ABSTRACT

The semiconductor device may include a first sub-pipe gate having a pipe hole formed therein; a second sub-pipe gate disposed on the first sub-pipe gate and passed-through by vertical holes being coupled to the pipe hole, wherein a material of the second sub-pipe gate has a lower oxidation rate than that of a material of the first sub-pipe gate; a first oxidized layer formed within a portion of the first sub-pipe gate to conform to a contour of the pipe hole; and a second oxidized layer formed within a portion of the second sub-pipe gate to conform to a contour of the vertical holes and the contour of the pipe hole.

10 Claims, 19 Drawing Sheets

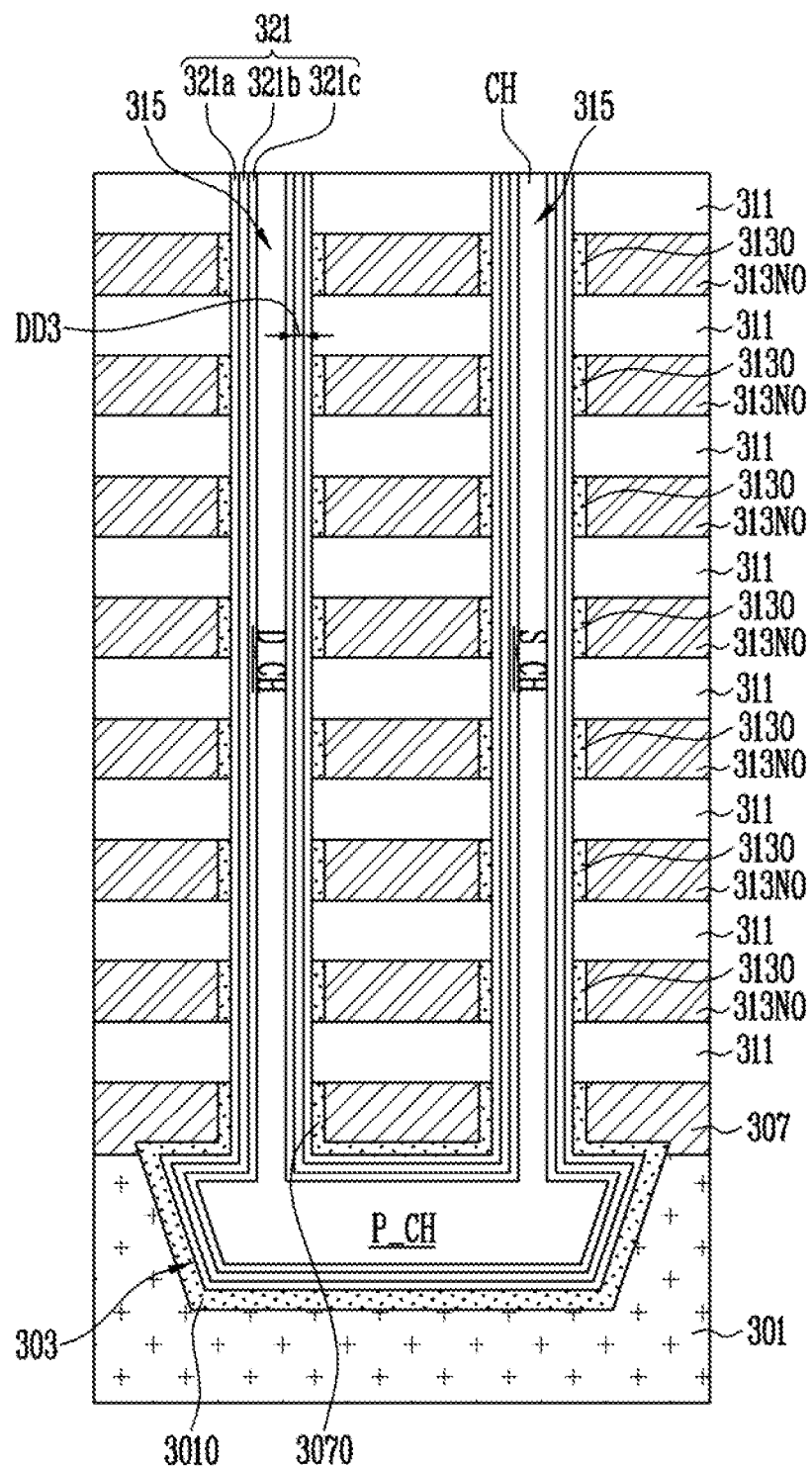

MEMORY DEVICE HAVING A PIPE TRANSISTOR AND SUB-PIPE GATE MATERIALS WITH DIFFERENT OXIDATION RATES

CROSS-REFERENCE TO RELATED APPLICATION

The present application claims a priority to a Korean patent application number 10-2015-0144163 filed on Oct. 15, 2015, which is incorporated herein by reference in its entirety.

BACKGROUND

Technical Field

The present disclosure generally relates to a semiconductor device, and, more particularly, to a three-dimensional memory device and a method for manufacturing the same.

Discussion of Related Arts

A semiconductor device may include a memory device for storing data therein. When a memory device is implemented as a NAND flash memory device, it may include a plurality of strings, each string comprising a plurality of memory cells connected in series. For achieving a high integration of the semiconductor device, a three-dimensional memory device has been suggested which has a series connection of three-dimensional arrangements of memory cells on a memory string basis.

For example, two vertical arrangements of the memory cells are coupled to each other via a pipe transistor to form a single memory string.

FIGS. 1A and 1B illustrate threshold voltage shift characteristics of a memory device such as a NAND flash memory device due to multiple iterations of program and erase operations. More particularly, FIGS. 1A and 1B illustrate a distribution of a threshold voltage of a pipe transistor and of memory cells, respectively.

Referring to FIG. 1A, it is seen that, as the number of repetitions of the program and erase operations, in other words, the number of erase/write (EW) cycles increase, the threshold voltage distribution of the pipe transistor shifts to the right, i.e., to higher voltages. When the threshold voltage distribution of the pipe transistor increases, a program disturb characteristic of the memory cells may deteriorate as shown in FIG. 1B.

SUMMARY

Embodiments of the present disclosure are directed to a semiconductor device capable of reducing a threshold voltage shift of a pipe transistor, and a manufacturing method of the same.

In one aspect of the present disclosure, there is provided a semiconductor device including: a first sub-pipe gate having a pipe hole formed therein; a second sub-pipe gate disposed on the first sub-pipe gate and passed-through by vertical holes being coupled to the pipe hole, wherein a material of the second sub-pipe gate has a lower oxidation rate than that of a material of the first sub-pipe gate; a first oxidized layer formed within a portion of the first sub-pipe gate to conform to a contour of the pipe hole; and a second oxidized layer formed within a portion of the second sub-pipe gate to conform to a contour of the vertical holes and the contour of the pipe hole.

In one aspect of the present disclosure, there is provided a method for manufacturing a semiconductor device, the method comprising: forming a first sub-pipe gate having embedded therein a pipe sacrificial layer; forming a second sub-pipe gate on the first sub-pipe gate, wherein a material of the second sub-pipe gate has an oxidation rate lower than that of a material of the first sub-pipe gate; forming at least one vertical hole passing-through the second sub-pipe gate, the at least one vertical hole exposing the pipe sacrificial layer; removing the pipe sacrificial layer through the at least one vertical hole to open a pipe hole within the first sub-pipe gate, the pipe hole being coupled to the at least one vertical hole; and oxidizing the first and second sub-pipe gates through the pipe hole and the at least one vertical hole to form first and second oxidized layers, wherein the first oxidized layer results from an oxidation of a portion of the first sub-pipe gate, and the second oxidized layer results from an oxidation of a portion of the second sub-pipe gate.

BRIEF DESCRIPTION OF THE DRAWINGS

FIG. 7A to FIG. 7D are cross-sectional views of a method for manufacturing the semiconductor device shown in FIG. 3C, according to an embodiment of the present disclosure.

DETAILED DESCRIPTIONS

Figure 1A:
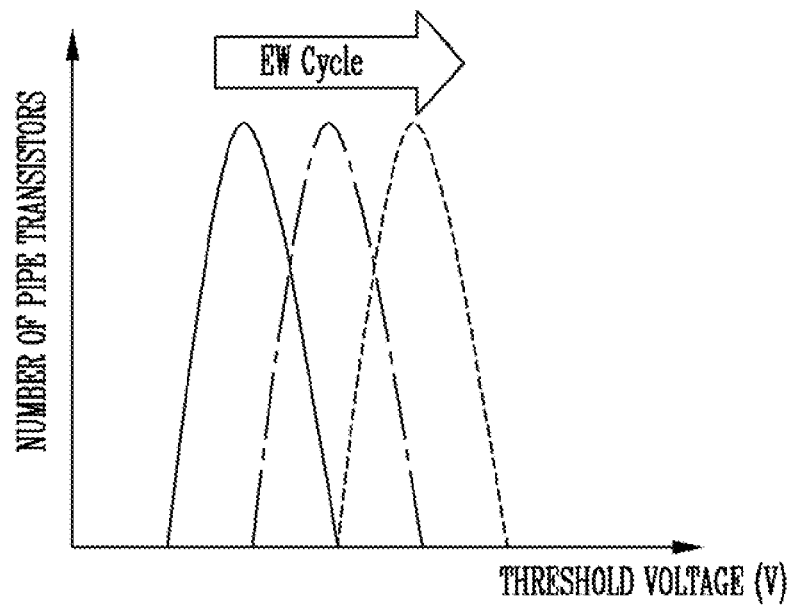
FIG. 1A and FIG. 1B illustrate threshold voltage distributions of pipe transistors, and of memory cells of a 3-D semiconductor memory device, respectively, as a function of an increasing number of EW cycles.
Figure 1B:
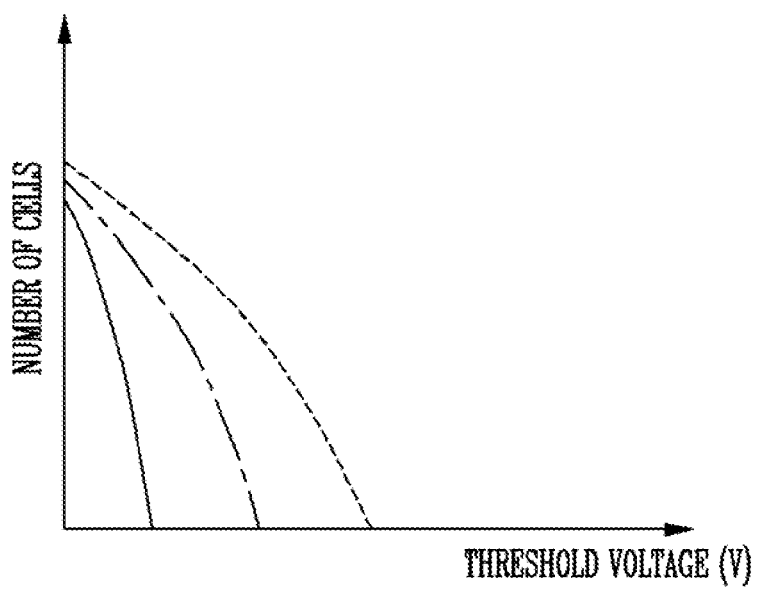

Examples of various embodiments are illustrated in the accompanying drawings and described further below. It will be understood that the description herein is not intended to limit the invention to the specific embodiments described. On the contrary, it is intended that the invention covers alternatives, modifications, and equivalents as may be included within the spirit and scope of the invention as defined by the appended claims.

Example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey various aspects and features of the present disclosure to those skilled in the related art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "includes", "has" and variations thereof, when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items.

Moreover, spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

Unless otherwise defined, all terms including technical and scientific terms used herein have the same meaning as commonly understood by one of ordinary skill in the art to which this inventive concept pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It is further noted that in the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Figure 2:
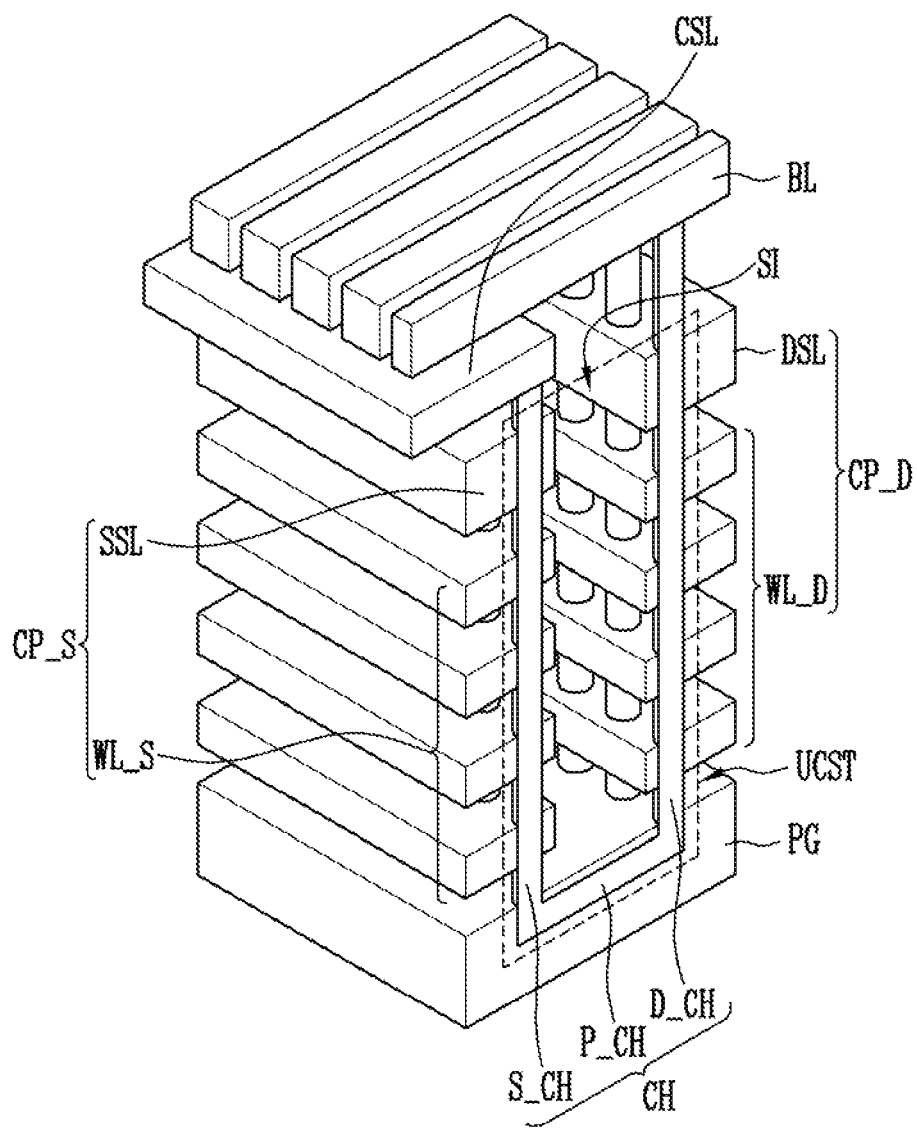
FIG. 2 illustrates a perspective view of a 3-D semiconductor memory device, according to an embodiment of the present disclosure.

Hereinafter, the various embodiments of the present disclosure will be described in more detail with reference to the drawings. Referring now to FIG. 2, a perspective view of a 3-D semiconductor device is provided, according to an embodiment of the present disclosure. The semiconductor device may include a U type memory string UCST. The U type memory string UCST may include a U type channel layer CH having a base channel and two channel columns extending in a direction substantially perpendicular to the base channel. A plurality of conductive patterns CP_S, and CP_D surround the channel columns of the channel layer CH and are spaced apart at regular intervals along the direction in which the channel columns of the channel layer extend. A pipe gate PG layer is disposed under the conductive patterns CP_S, and CP_D and is surrounding the base channel of the channel layer CH.

The base channel of the channel layer CH is hereinafter referred to as a pipe channel layer P_CH, whereas the channel columns are referred to as a source side channel layer S_CH, and a drain side channel layer D_CH. The pipe channel layer P_CH may be buried in the pipe gate PG. The source side channel layer S_CH and the drain side channel layer D_CH each may extend vertically or substantially vertically upwards from the pipe channel layer P_CH. The shape of the channel layer CH may vary. For example, the channel layer may have a tube form having a hollow portion formed therein. The channel layer CH may have a solid rod form without a hollow portion formed therein. The shape and dimensions of the cross section of the channel layer CH may vary. For example, the cross section of the channel layer CH may have a shape that is cylindrical, rectangular, polygonal and or a combination thereof. In an embodiment the channel layer may have a tube form having a cylindrical cross section. The cross section of the channel layer CH may be constant along its entire length. The source side channel layer S_CH and the drain side channel layer D_CH may have a tapered cross section which may be increasing as they extend further away from the pipe channel P_CH.

Although not shown in FIG. 2, a multi-layered structure including a data storage layer may be formed to conform to an outer-wall of the channel layer CH, or may be formed to conform to an outer-wall of each of the conductive patterns CP_S, and CP_D. At the latter case, the multi-layered structure may be divided into multiple sub-structures by a slit SI.

The channel layer CH may be disposed between a common source line CSL and a bit line BL and electrically connected to the common source line CSL and the bit line BL. The bit line BL and the common source line CSL may be disposed at different levels. For example, the common source line CSL may be disposed under the bit line BL. The bit line BL may be disposed above the drain side channel layer D_CH and be electrically connected to the drain side channel layer D_CH. A contact plug (not shown) may be formed between the bit line BL and the drain side channel layer D_CH. The common source line CSL may be disposed above the source side channel layer S_CH and be electrically connected to the source side channel layer S_CH. A contact plug (not shown) may be formed between the common source line CSL and the source side channel layer S_CH.

The pipe gate PG may be disposed under the bit line BL, the common source line CSL, and the conductive patterns CP_S, CP_D, and may surround the pipe channel layer P_CH.

The conductive patterns CP_S and CP_D may include the source side conductive patterns CP_S and the drain side conductive patterns CP_D divided by the slit SI. The source side conductive patterns CP_S and the drain side conductive patterns CP_D may be disposed under the bit line BL and the common source line CSL.

The source side conductive patterns CP_S may include a vertical arrangement of source side word lines WL_S and a source select line SSL along the source side channel layer S_CH. The source side word lines WL_S may be disposed between the common source line CSL and the pipe gate PG. The source select line SSL may be disposed between the common source line CSL and the source side word lines WL_S. The source select line SSL between the common source line CSL and source side word lines WL_S may be disposed at a single level or plural levels.

The drain side conductive patterns CP_D may include a vertical arrangement of drain side word lines WL_D and a drain select line DSL along the drain side channel layer D_CH. The drain side word lines WL_D may be disposed between the bit line BL and the pipe gate PG. The drain select line DSL may be disposed between the bit line BL and the drain side word lines WL_D. The drain select line DSL between the bit line BL and the drain side word lines WL_D may be disposed at a single level or plural levels.

In the above configuration of the semiconductor device, each of the source side memory cells may be formed at each of the intersections between the source side channel layer S_CH and the source side word lines WL_S, and each of drain side memory cells may be formed at each of intersections between the drain side channel layer D_CH and the drain side word lines WL_D. A source select transistor may be formed at an intersection between the source side channel layer S_CH and the source select line SSL, and a drain select transistor may be formed at an Intersection between the drain side channel layer D_CH and the drain select line DSL. The pipe transistor may be formed at an intersection between the pipe channel layer P_CH and the pipe gate PG. A series connection of the source select transistor, the source side memory cells, the pipe transistor, the drain side memory cells, and the drain select transistor along a single channel layer CH may form a single U type memory string UCST. Each of the source side word lines WL_S may transmit a signal to each of gates of the source side memory cells. Each of the drain side word lines WL_D may transmit a signal to each of gates of the drain side memory cells. The source select line SSL may transmit a signal to a gate of the source select transistor. The drain select line DSL may transmit a signal to a gate of the drain select transistor. The pipe gate PG may transmit a signal to a gate of the pipe transistor.

In a program operation, a pass voltage may be supplied to the pipe gate PG to turn on the pipe transistor. In an embodiment, the pipe transistor may have a structure to be described with reference to FIGS. 3A to 3C which allows a pass voltage having a sufficiently-high level to be applied thereto for reducing pass disturbance of the pipe transistor. When pass disturbance of the pipe transistor is reduced, a threshold voltage shift of the pipe transistor may also decrease, hence, improving the overall operation characteristics of the semiconductor device.

Although, in the embodiment shown in FIG. 2, the channel layer CH and the memory string UCST may have a U shape, it is noted that the invention may not be limited in this way and that a variety of other forms may be employed including for example a W shape structure.

Figure 3A:
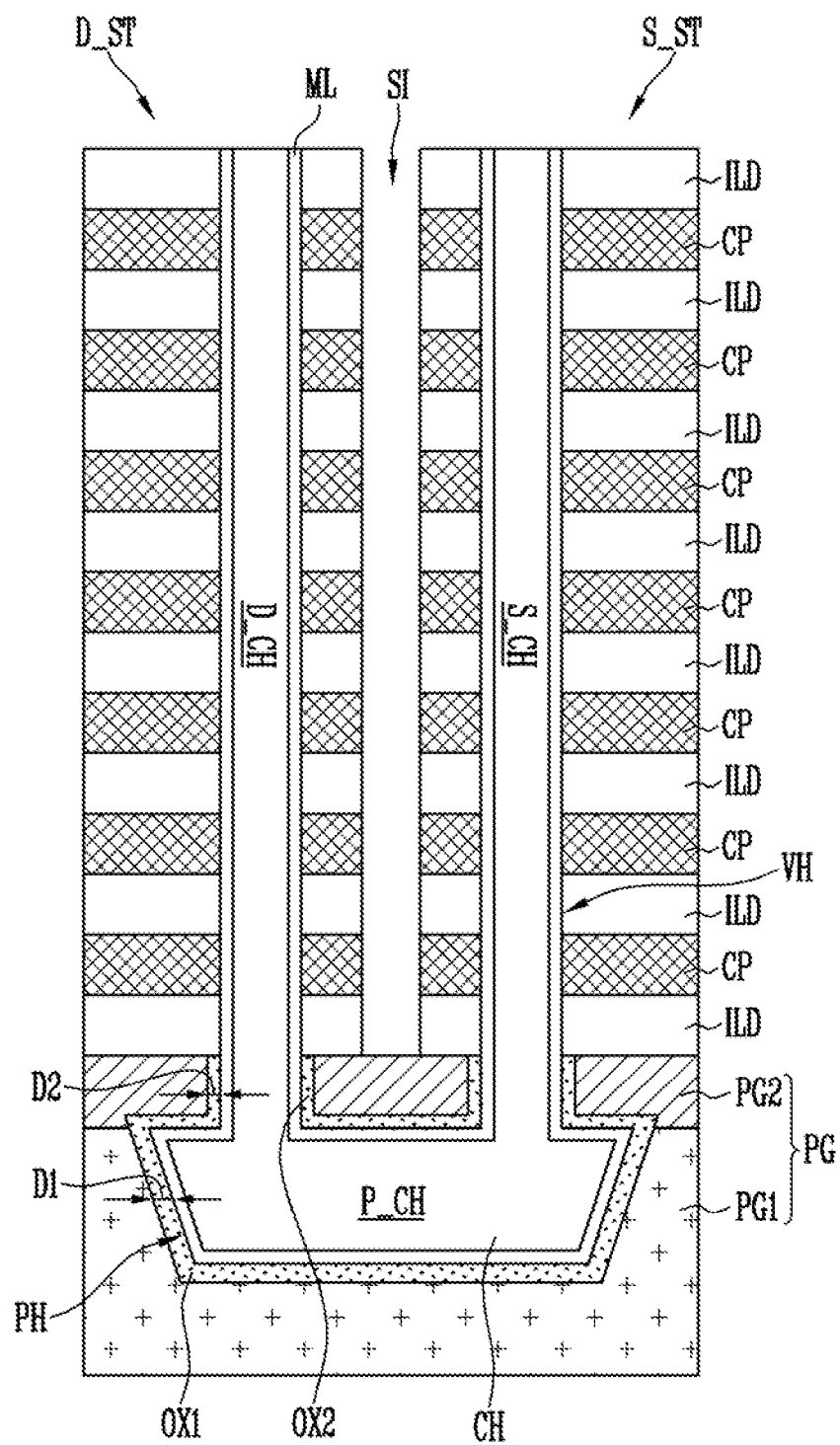
FIGS. 3A to 3C are cross-sectional views of the semiconductor memory device of FIG. 2, according to various embodiments of the present disclosure.
Figure 3B:
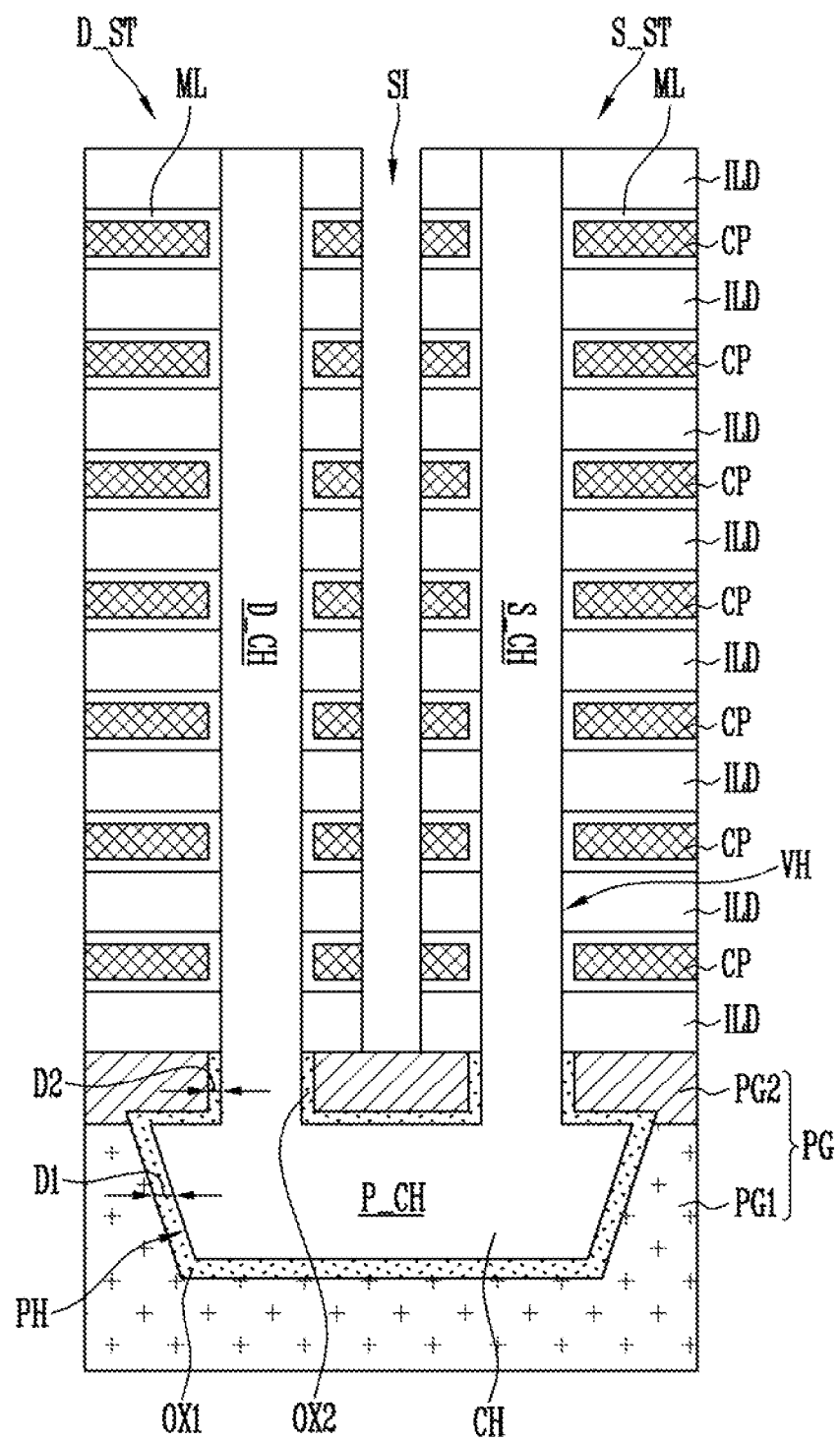
Figure 3C:
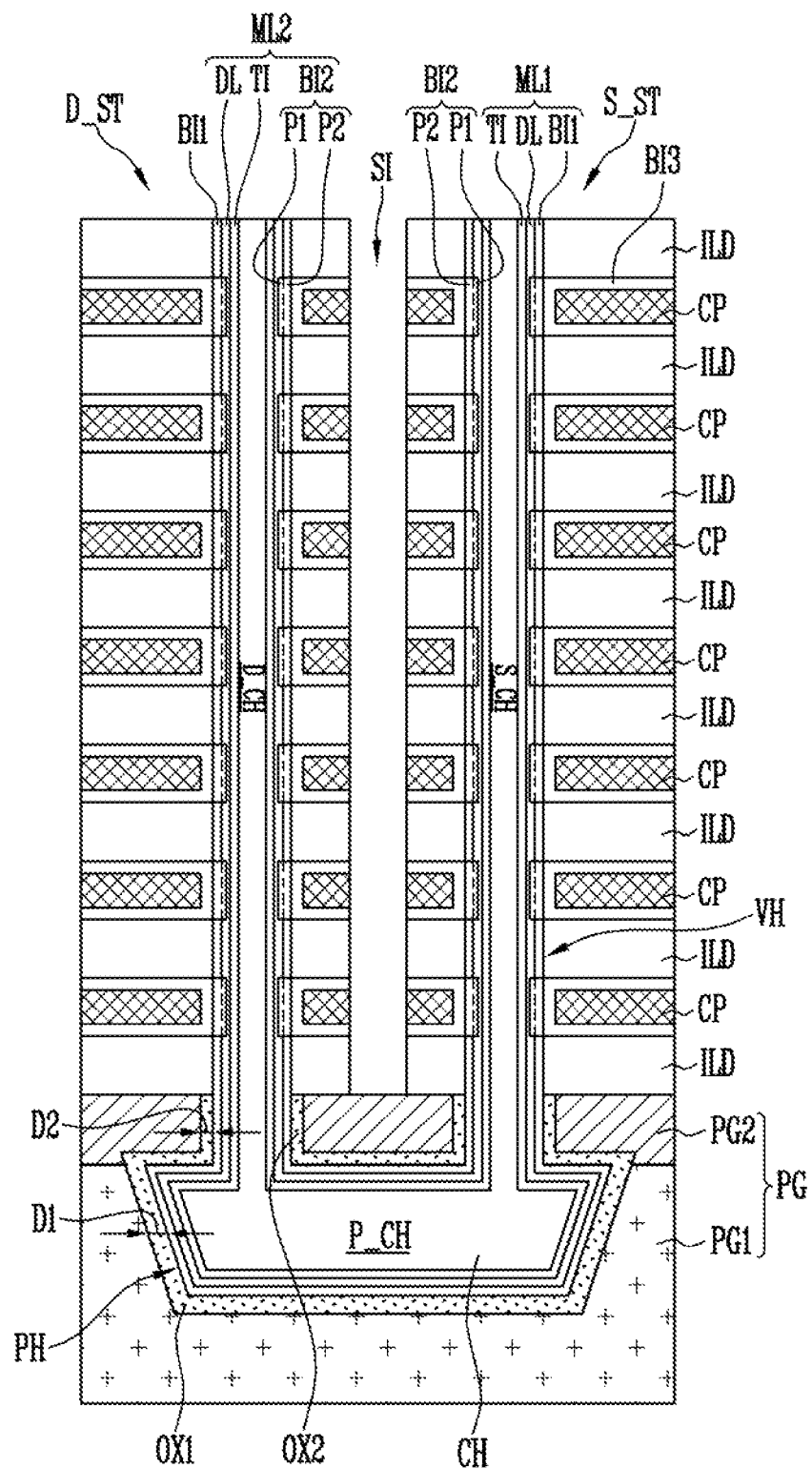

Referring now to FIGS. 3A to 3C, various cross-sectional views of a three-dimensional semiconductor memory device according to various embodiments of the present disclosure are provided. Accordingly, a three-dimensional memory device according to embodiments of the present disclosure may include a three-dimensional arrangement of memory cells along a channel layer CH. The channel layer CH may include a pipe channel layer P_CH, a source side channel layer S_CH and a drain side channel layer D_CH. Each of the source side channel layer S_CH and the drain side channel layer D_CH may extend vertically upwards from the pipe channel layer P_CH.

The channel layer CH may be surrounded having a pipe gate PG, interlayer insulating layers ILD and conductive patterns CP. The pipe gate PG may include a first sub-pipe gate PG1, and a second sub-pipe gate PG2 disposed on a top of the first sub-pipe gate PG1. A pipe hole PH may be formed within the first sub-pipe gate PG1. The pipe hole PH may be covered with the second sub-pipe gate PG2. The interlayer insulating layers ILD and the conductive patterns CP may be alternately stacked on a top of the pipe gate PG. A stack including interlayer insulating layers ILD and the conductive patterns CP may be divided into a source side stack S_ST and a drain side stack D_ST by a slit SI disposed between the source side channel layer S_CH and the drain side channel layer D_CH. Each of the source side stack S_ST and the drain side stack D_ST may be passed-through by each of vertical holes VH. Each of the vertical holes VH may pass-through the second sub-pipe gate PG2 and may be coupled to the pipe hole PH. The channel layer CH may be formed in a channel hole including the pipe hole PH and at least one pair of the vertical holes VH coupled to the pipe hole PH. The channel layer CH may be formed along the channel hole. More specifically, the pipe channel layer P_CH may be formed in the pipe hole PH, the source side channel layer S_CH may be formed in a source side vertical hole VH passing-through the source side stack S_ST and the second sub-pipe gate PG2, and the drain side channel layer D_CH may be formed in a drain side vertical hole passing-through the drain side stack D_ST and the second sub-pipe gate PG2.

In order to thicken an insulating layer for the pipe transistor and, at the same time, prevent the vertical holes VH from being overly narrow, the first and second sub-pipe gates PG1 and PG2 may have different oxidation rates. More specifically, the first sub-pipe gate PG1 may have an oxidation rate higher than that of the second sub-pipe gate PG2. In other words, the second sub-pipe gate PG2 may have an oxidation rate lower than that of the first sub-pipe gate PG1. The oxidation rates of the first and second sub-pipe gates PG1 and PG2 may be controlled based on properties of the materials used to form the first and second sub-pipe gates PG1 and PG2. For example, the first and second sub-pipe gates PG1 and PG2 may be formed of poly-silicon materials with different silicon concentrations. For example, the first sub-pipe gate PG1 may have a higher silicon concentration than the second sub-pipe gate PG2. In this way, the first sub-pipe gate PG1 may have an oxidation rate higher than that of the second sub-pipe gate PG2.

Through the vertical holes VH and the pipe hole PH, the first and second sub-pipe gates PG1 and PG2 may be oxidized. This may result in a first oxidized layer OX1 and a second oxidized layer OX2. The first oxidized layer OX1 may be formed within a portion of the first sub-pipe gate PG1 along a contour of the pipe hole PH. The second oxidized layer OX2 may be formed within a portion of the second pipe gate PG2 along contours of the vertical holes VH and the contour of the pipe hole PH. In other words, the first oxidized layer OX1 may result from an oxidation of the portion of the first sub-pipe gate PG1 material contacting the pipe hole PH. The second oxidized layer OX2 may result from an oxidation of a portion of the second sub-pipe gate PG2 material contacting the vertical surfaces of the vertical holes VH and an oxidation of a portion of the second sub-pipe gate PG2 material contacting the pipe hole PH.

In accordance with this embodiment of the present disclosure where properties of materials of the first and second sub-pipe gates PG1 and PG2 are selected so that the first sub-pipe gate PG1 has a higher oxidation rate than that of the second sub-pipe gate PG2, a thickness of an oxidized layer of the first sub-pipe gate PG1 may be larger than that of the second sub-pipe gate PG2. As a result, the first oxidized layer OX1 may have a thickness D1 larger than a thickness D2 of the second oxidized layer OX2. The first oxidized layer OX1 may surround the pipe channel layer P_CH acting as a channel layer of the pipe transistor and, hence, serve as a gate insulating layer.

In a program operation, due to the higher thickness, first oxidized layer OX1, the pipe gate PG may be supplied having a high pass voltage. This may in turn enhance the booting efficiency of the channel layer CH. Moreover, when the pipe gate PG of a program-inhibited memory string is supplied having a high pass voltage in a program operation, disturbance of the transistor may be reduced. As described above, this embodiment may ensure that the first oxidized layer OX1 acting as the gate insulating layer for the pipe transistor may be thickened, i.e., achieve an increased thickness sufficient to allow the pipe gate PG to be supplied having a higher pass voltage and, hence, an operation characteristic of the semiconductor device may improve. In addition, the second oxidized layers OX2 formed along contours of sidewalls of the vertical holes VH may be thinned, i.e., achieve a sufficiently reduced thickness to prevent the vertical holes VH from being overly narrow and, hence, the channel layer CH formation in the pipe hole PH may be completed more reliably. This may lead to an improved yield of the semiconductor device.

The semiconductor device according to an embodiment of the invention may further include multi-layered structure ML, ML1 or ML2 surrounding the channel layer CH as shown in FIGS. 3A to 3C.

In an embodiment, the multi-layered structure ML may extend along contours of surfaces of the pipe hole PH and the vertical holes VH connecting the pipe hole PH as shown in FIG. 3A. In this way, the multi-layered structure ML may surround an entirety of an outer sidewall of the channel layer CH.

In an embodiment, the multi-layered structure ML may extend along each of the surfaces of the conductive patterns CP to have a C shaped form as shown in FIG. 3B. In this way, the multi-layered structure ML having the C shaped form is opened only at the slit SI side. The multi-layered structure ML may include an arrangement of multiple materials layers including a data storage layer.

In an embodiment, the channel layer CH may be surrounded having a first type multi-layered structure ML1 and a second type multi-layered structure ML2, as shown in FIG. 3C. The first type multi-layered structure ML1 may be formed between each of the Interlayer insulating layers ILD and the channel layer CH, and between the pipe gate PG and the channel layer CH. The second type multi-layered structure ML2 may be formed between each of the conductive patterns CP and the channel layer CH.

Referring to FIG. 3C, the semiconductor device, according to an embodiment of the invention, may further include a tunnel insulating layer TI surrounding an outer wall of the channel layer CH, and a data storage layer DL surrounding an outer wall of the tunnel insulating layer TI. The tunnel insulating layer TI may include a silicon oxide layer. The data storage layer DL may be formed of a material having a data storage ability. For example, the data storage layer DL may be formed of silicon, nitride, phase-transformation material, nano-dot, etc. The tunnel insulating layer TI and the data storage layer DL may conform to an outer wall of the channel layer CH facing the conductive patterns CP, the interlayer insulating layers ILD and the pipe gate PG. Each of main portions of the data storage layer DL respectively facing the conductive patterns CP may have a smaller thickness than that of each of dummy portions of the data storage layer DL respectively facing the interlayer insulating layers ILD and the pipe gate PG. In this way, the data storage layer DL may have multiple recesses formed in an outer portion thereof at the main portions locations.

Each of the dummy portions of the data storage layer DL may be surrounded with a first blocking insulating layer BI1. Each of the recesses in the data storage layer DL may be filled with a second blocking insulating layer BI2. In other words, each of the main portions of the data storage layer DL may be surrounded with the second blocking insulating layer BI2. The second blocking insulating layer BI2 may include a first portion P1 and a second portion P2. The first portion P1 may be formed of a partially oxidized data storage layer DL. The second portion P2 may grow from the first portion P1 toward a side wall of the conductive pattern CP. Each of the first and second blocking insulating layers BI1 and BI2 may be formed of an oxide.

The first type multi-layered structure ML1 may include the first blocking insulating layer BI1, the dummy portion of the data storage layer DL, and a portion of the tunnel insulating layer TI contacting the dummy portion of the data storage layer DL. The second type multi-layered structure ML2 may include the second blocking insulating layer BI2, the main portion of the data storage layer DL, and a portion of the tunnel insulating layer TI contacting the main portion of the data storage layer DL.

The semiconductor device, according to an embodiment of the present disclosure, may further include a third blocking insulating layer BI3 extending along a surface of each of the conductive patterns CP. A portion of the third blocking insulating layer BI3 may be disposed between a side wall of each of the conductive patterns CP and the second blocking insulating layer BI2. The third blocking insulating layer BI3 may be formed of an insulating material having a larger dielectric constant than those of the first and second blocking insulating layers BI1 and BI2. For example, the third blocking insulating layer BI3 may include a metal oxide layer. More specifically, the third blocking insulating layer BI3 may be formed of $A_2O_3$.

Figure 4:
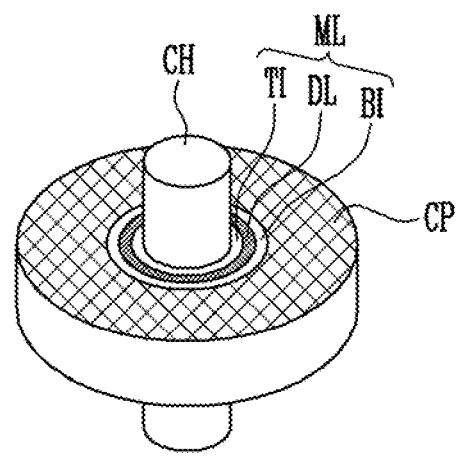
FIG. 4 illustrates a perspective view for explaining a multi-layered structure in the vicinity of a channel, according an embodiment of the present disclosure.

FIG. 4 is an enlarged perspective view illustrating a section of a multi-layered structure as shown in FIGS. 3A and 3B near the vicinity of the channel layer CH.

Referring to FIG. 4, at least portion of the multi-layered structure ML may be disposed between the conductive pattern CP and the channel layer CH. The multi-layered structure ML may include the tunnel insulating layer TI surrounding an outer wall of the channel layer CH, the data storage layer DL surrounding an outer wall of the tunnel insulating layer TI, and the blocking insulating layer BI surrounding an outer wall of the data storage layer DL. The tunnel insulating layer TI may include a silicon oxide layer. The data storage layer DL may be formed of a material having a data storage ability. For example, the data storage layer DL may be formed of silicon, nitride, phase-transformation material, nano-dot, etc. The blocking insulating layer BI may act to block a charge. The blocking insulating layer BI may include a silicon oxide layer or a metal oxide layer having a higher dielectric constant than that of the silicon oxide layer, or include a combination of the silicon oxide layer and the metal oxide layer. For example, the blocking insulating layer BI may be formed of $Al_2O_3$. When the multi-layered structure ML including the blocking insulating layer BI formed of $Al_2O_3$ extends to surround the pipe channel layer P_CH as shown in FIG. 3A, a threshold voltage of the pipe transistor may be kept constant through soft-erasing of the pipe transistor in an erase operation.

Hereinafter, methods for manufacturing the semiconductor devices according to the above-described embodiments will be described.

FIGS. 5A to 5F are cross-sectional views of various stages of a method for manufacturing the semiconductor device shown in FIG. 3A.

Figure 5A:
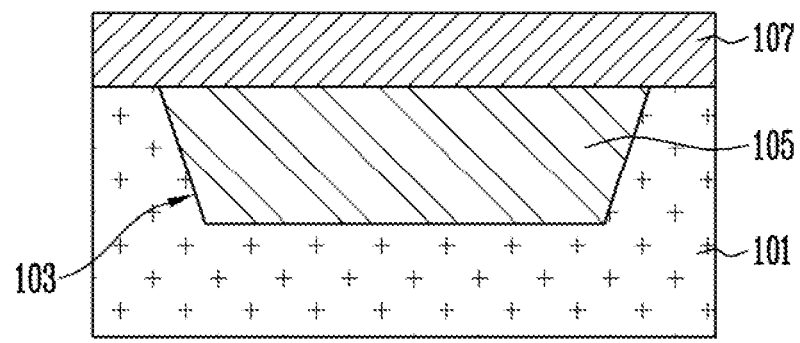
FIGS. 5A to 5F are cross-sectional views illustrating various stages of a manufacturing method for the semiconductor device shown in FIG. 3A, according to an embodiment of the present disclosure.

Referring to FIG. 5A, a first sub-pipe gate 101 having embedded therein a pipe sacrificial layer 105 may be provided. The pipe sacrificial layer 105 may fill a pipe hole 103 formed in the first sub-pipe gate 101. For this, first, the first sub-pipe gate 101 may be formed. The first sub-pipe gate 101 may be formed of poly-silicon. After this, the first sub-pipe gate 101 may be etched to form the pipe hole 103 in the first sub-pipe gate 101. Then, the pipe hole 103 may be filled with the pipe sacrificial layer 105. The pipe sacrificial layer 105 may be formed of a different material from the material of the first sub-pipe gate 101, a subsequently-formed second sub-pipe gate 107, and subsequently-formed first and second material layers (see FIG. 5B). More specifically, the pipe sacrificial layer 105 may be formed of a material having a different etching selectivity from etching selectivities of materials of the first sub-pipe gate 101, the second sub-pipe gate 107, the first material layer and the second material layer. For example, the pipe sacrificial layer 105 may be formed of TIN.

The second sub-pipe gate 107 may be formed on the first sub-pipe gate 101 to cover the pipe sacrificial layer 105. The second sub-pipe gate 107 may be formed of a material having an oxidation rate lower than that of a material of the first sub-pipe gate 101. For example, the second sub-pipe gate 107 may be formed of a poly-silicon having a different silicon concentration from that of a poly-silicon of the first sub-pipe gate 101. More specifically, in forming the second sub-pipe gate 107, the silicon concentration may be controlled so that the first sub-pipe gate 101 has a silicon concentration higher than that of the second sub-pipe gate 107.

Figure 5B:
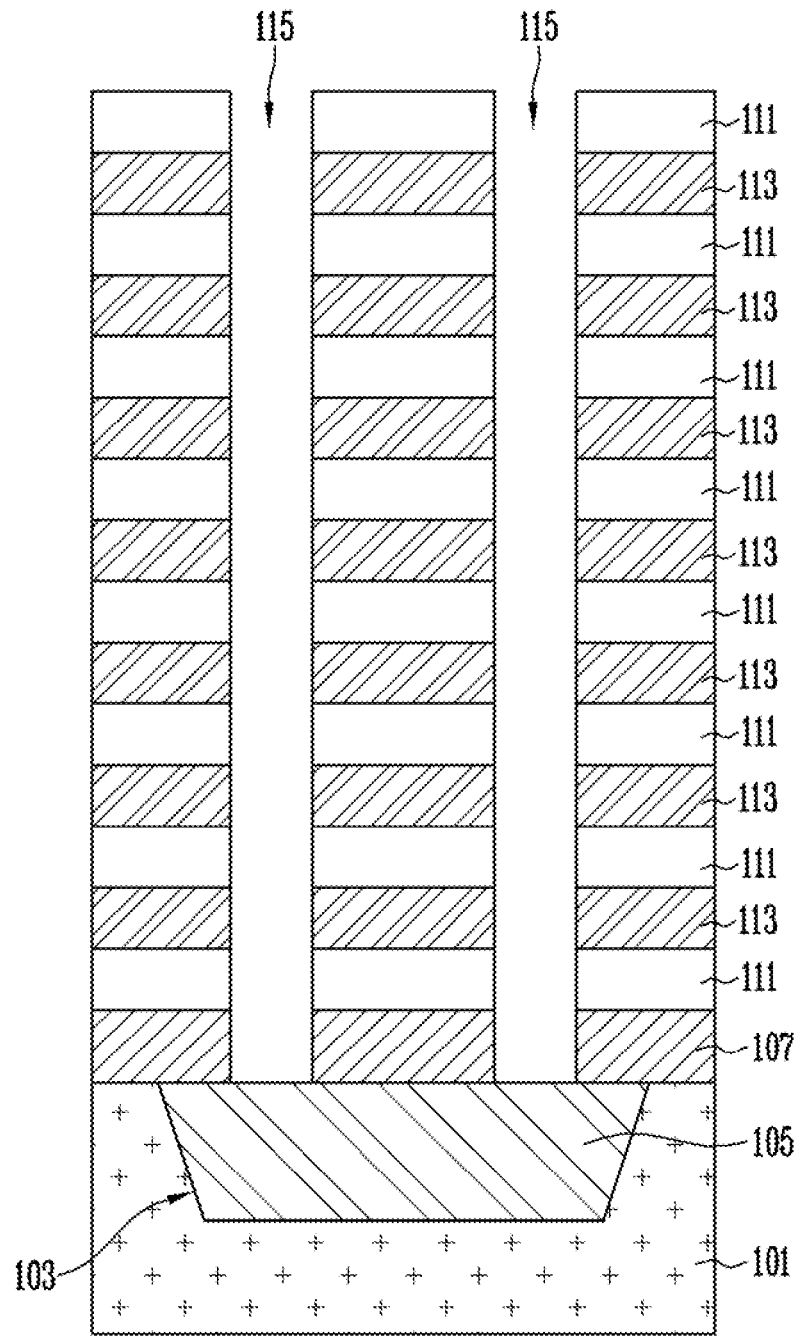

Referring to FIG. 5B, first and second material layers 111 and 113 may be alternately stacked on top of the second sub-pipe gate 107. Each of the first material layers 111 may be disposed at each of the interlayer insulating layers levels. Each of the second material layers 113 may be disposed at each of the conductive patterns levels. The first material layers 111 and the second material layers 113 may be formed of different materials. More specifically, the second material layers 113 may be formed of a material having a different etching selectivity from that of a material of the first material layers 111. For example, the first material layers 111 may be formed of an insulating material for an interlayer insulating layer, and the second material layers 113 may be formed of a sacrificial insulating material. In one example, the insulating material for the interlayer insulating layer may include an oxide, and the sacrificial insulating material may include a nitride. In this manner, when the first material layers 111 and the second material layers 113 may be formed of different kinds of the insulating material, the subsequent etching process for forming vertical holes 115 may be facilitated.

After they are formed, the first and second material layers 111 and 113 may be partially etched in the vertical direction to form the vertical holes 115 and partially expose the pipe sacrificial layer 105. At least one pair of the vertical holes 115 may be coupled to the pipe hole 103.

Figure 5C:
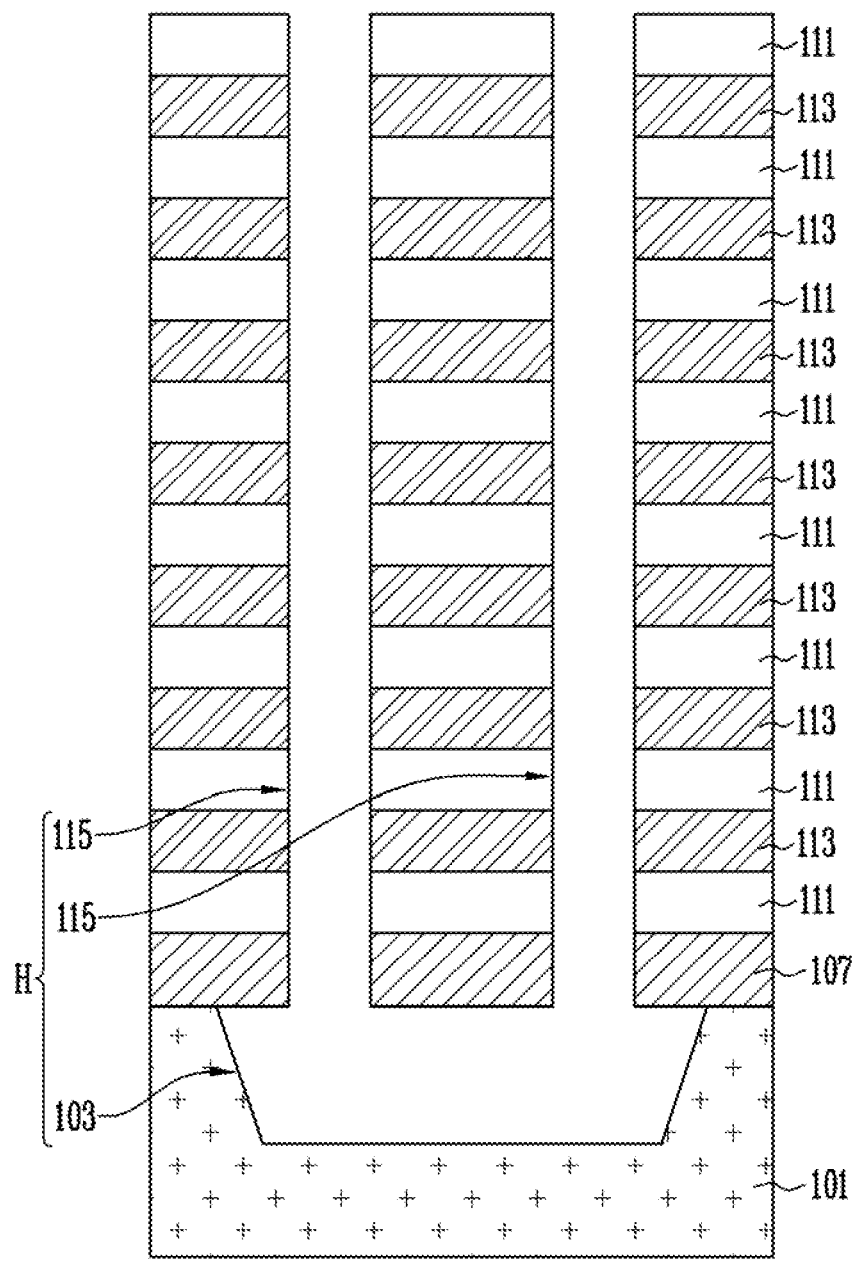

Referring to FIG. 5C, the pipe sacrificial layer 105 may be removed or etched away through the vertical holes 115 to open the pipe hole 103. Thus, the vertical holes 115 and the pipe hole 103 may be connected to form a channel hole H.

Figure 5D:
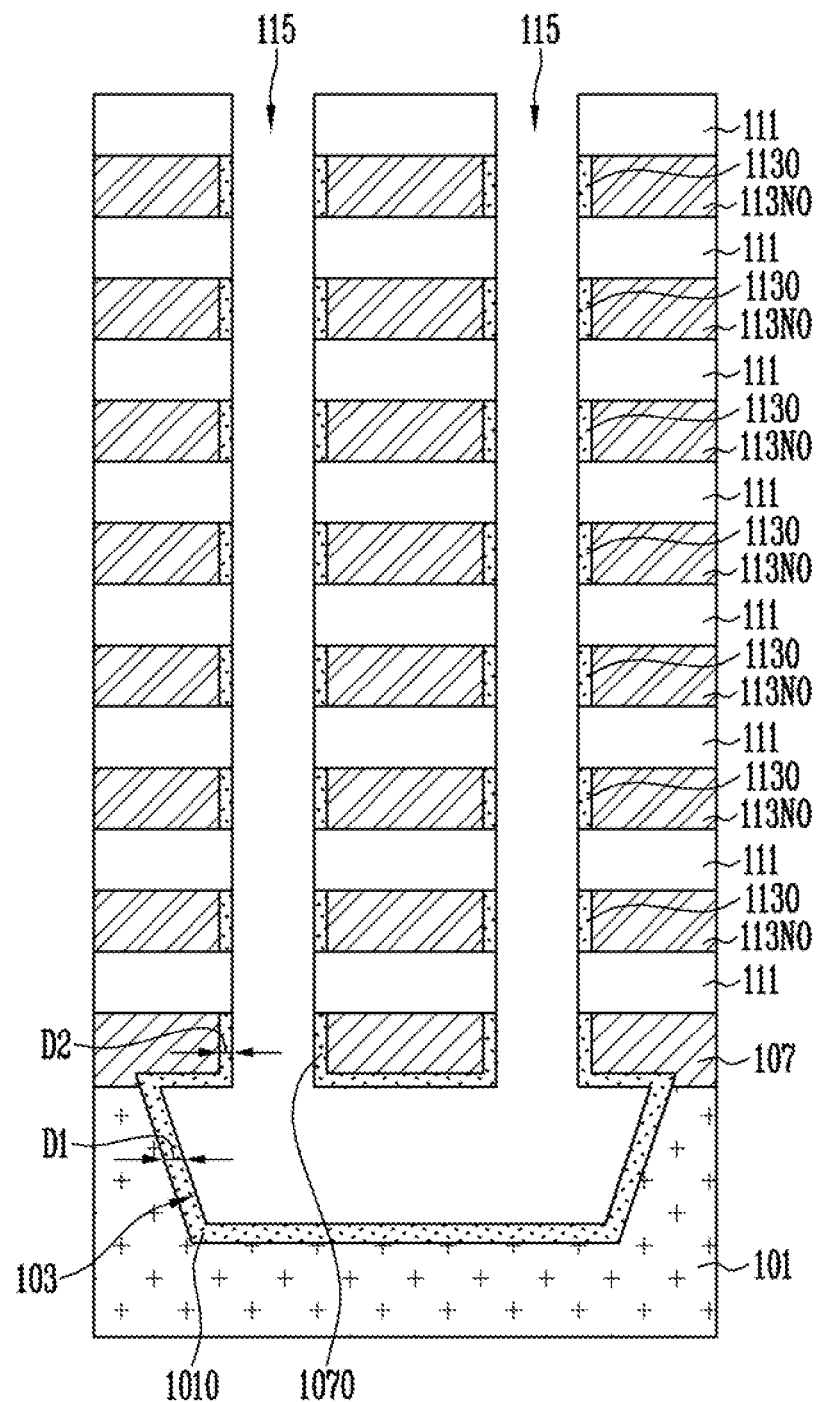

Referring to FIG. 5D, an oxidizing material may be injected into the channel hole H, and, hence, the first sub-pipe gate 101, the second sub-pipe gate 107, and the second material layers 113 may be partially oxidized, to form first to third oxidized layers 101O, 107O, and 113O at the same time. The first oxidized layer 101O may result from an oxidation of a portion of the first sub-pipe gate 101 along the pipe hole 103. The second oxidized layer 107O may result from an oxidation of a portion of the second sub-pipe gate 107 along the pipe hole 103, and an oxidation of portions of the second sub-pipe gate 107 along the vertical holes 115. Each of the third oxidized layers 113O may result from an oxidation of a portion of each of the second material layers 113 along the vertical holes 115. Hereinafter, for the sake of convenience of description, a non-oxidized portion of each of the second material layers 113 may be defined as a non-oxidized layer 113NO of each of the second material layers 113.

In accordance with the present disclosure, because the first sub-pipe gate 101 has a higher oxidation rate than that of the second sub-pipe gate 107, the first oxidized layer 101O achieves a thickness D1 that is larger than a thickness D2 of the second oxidized layer 107O. In other words, the second oxidized layer 107O may be thinner than the first oxidized layer 101O. Thus, the thickness D1 of the first oxidized layer 101O acting as a gate insulating layer of a pipe transistor may be larger, and, at the same time, the thickness D2 of the second oxidized layer 107O defining widths of bottoms of the vertical holes 115 may be prevented from overly increasing. In this way, this embodiment of the present disclosure may secure broad bottoms of the vertical holes 115.

Figure 5E:
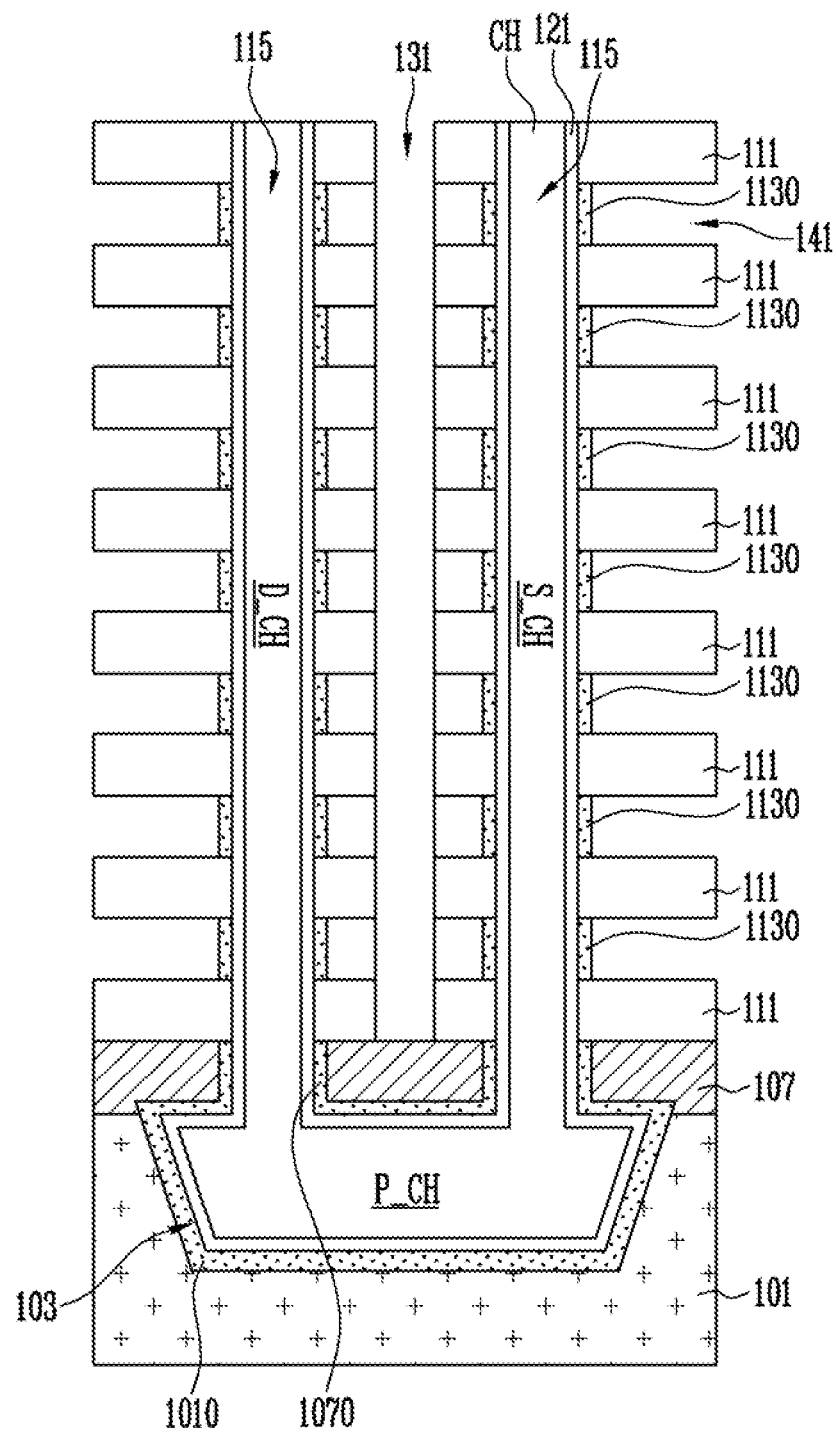

Referring to FIG. 5E, a multi-layered structure 121 may be formed to conform to an inner face of the channel hole including a connection of the vertical holes 115 and the pipe hole 103. The multi-layered structure 121 may include a blocking insulating layer, a data storage layer and a tunnel insulating layer in this order starting from an inner face of the channel hole, as shown in FIG. 4. The multi-layered structure 121 may be surrounded with the first to third oxidized layers 101O, 107O, and 113O and the first material layers 111.

Thereafter, within the channel hole including the connection of the vertical holes 115 and the pipe hole 103, a channel layer CH may be formed. The channel layer CH may have a tube form, a solid rod form or a combination thereof as described with reference to FIG. 2. The channel layer CH may include a pipe channel layer P_CH formed in the pipe hole 103. The channel layer CH may also include a drain side channel layer D_CH and a source side channel layer S_CH formed in respective vertical holes 115. An outer wall of the channel layer CH may be surrounded with the multi-layered structure 121. The channel layer CH may be formed of a semiconductor layer such as silicon.

Subsequently, a slit 131 may be formed by vertically partially etching the non-oxidized layers (113NO in FIG. 5D) of the second material layers 113, and the first material layers 111 between the vertical holes 115, in other words, between the source side channel layer S_CH and the drain side channel layer D_CH. The slit 131 may pass thorough the non-oxidized layers (113NO in FIG. 5D) of the second and first material layers 113 and 111. In this way, the non-oxidized layers (113NO in FIG. 5D) of the second and first material layers 113 and 111 may be exposed through the slit 131.

Next, through the silt 131, the non-oxidized layers (113NO in FIG. 5D) of the second material layers 113 may be removed horizontally to form openings 141. For example, the openings 141 may expose the third oxidized layers 113O. During removing the non-oxidized layers (113NO in FIG. 5D) of the second material layers 113 using etching, the third oxidized layers 113O may serve as an etching stop layer to protect the multi-layered structure 121 from the etching.

Figure 5F:
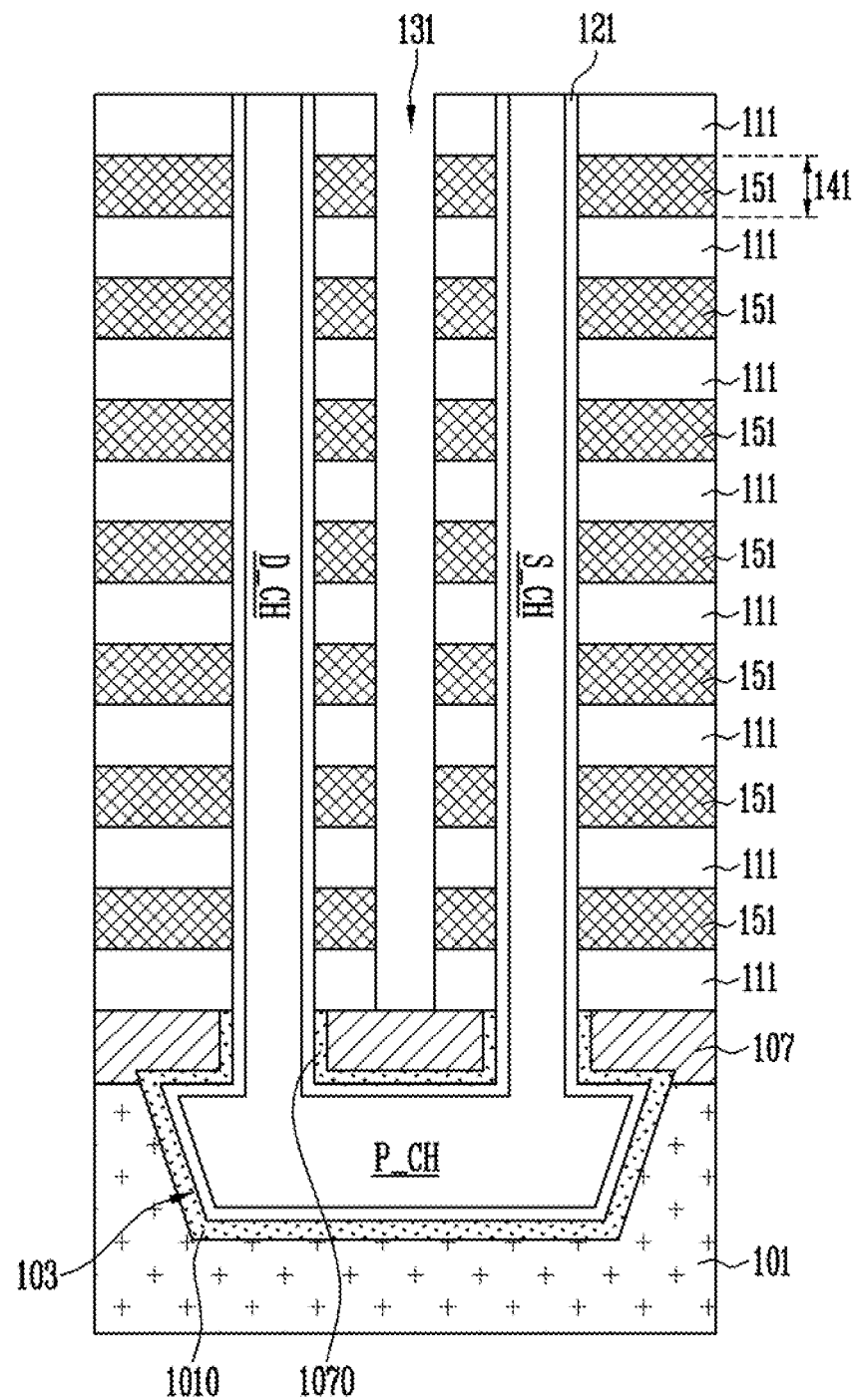

Referring to FIG. 5F, through the slit 131, the third oxidized layers 113O may be removed to broaden widths of the openings 141. After this, the openings 141 may be filled with conductive patterns 151.

In this way, by the process as described above with connection to FIG. 5A to FIG. 5F, the semiconductor device as shown in FIG. 3A may be formed.

Figure 6A:
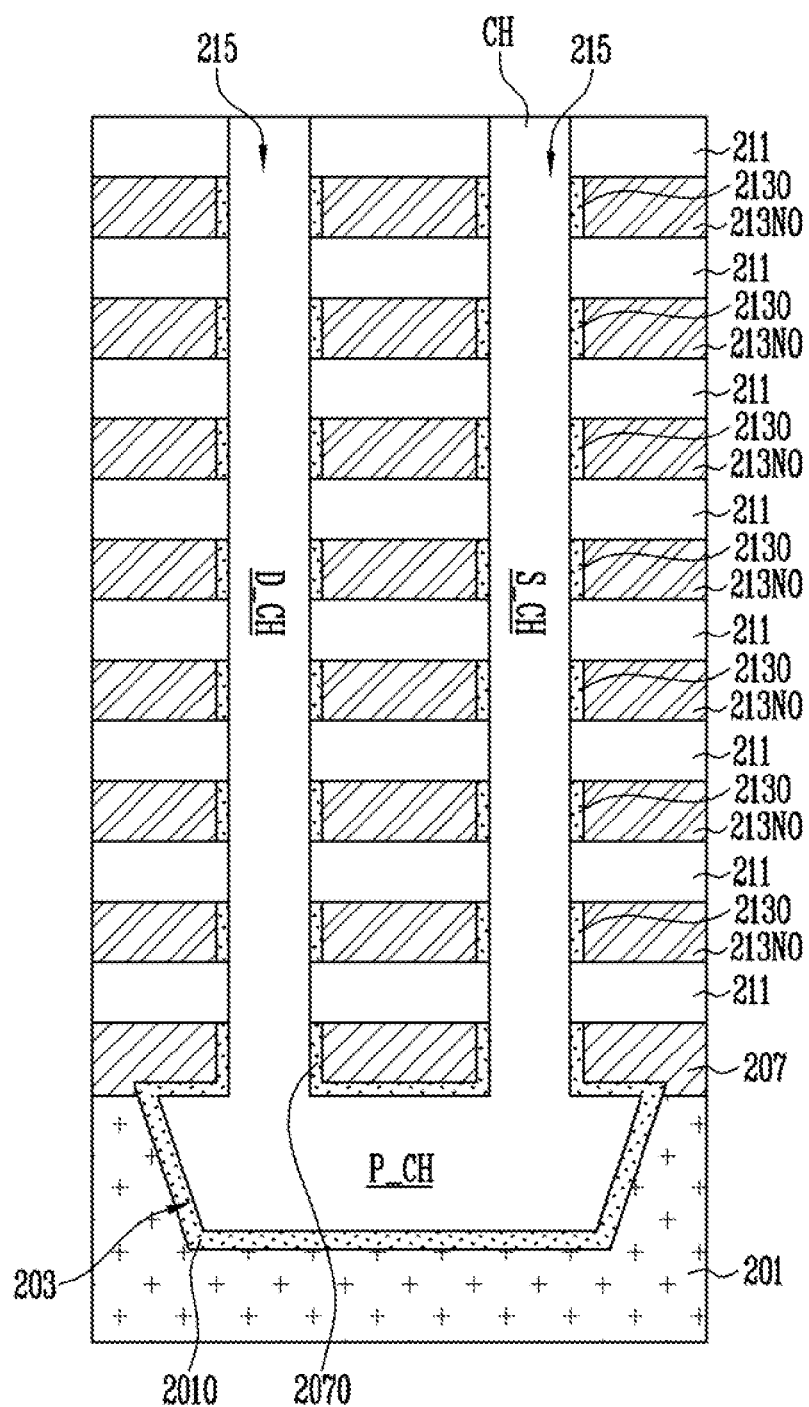
FIG. 6A to FIG. 6C are cross-sectional views illustrating various stages of a manufacturing method for the semiconductor device shown in FIG. 3B, according to an embodiment of the present disclosure.
Figure 6B:
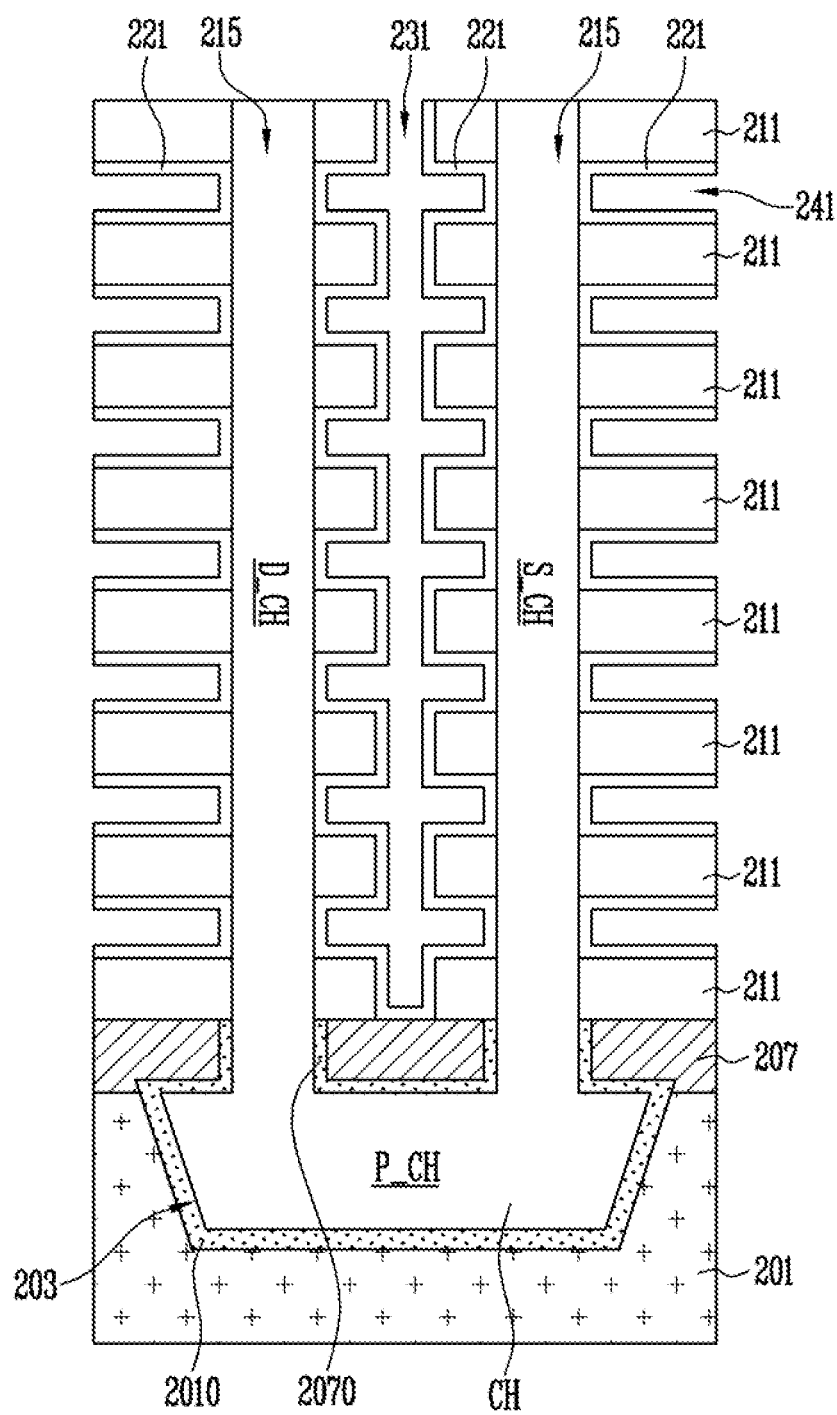
Figure 6C:
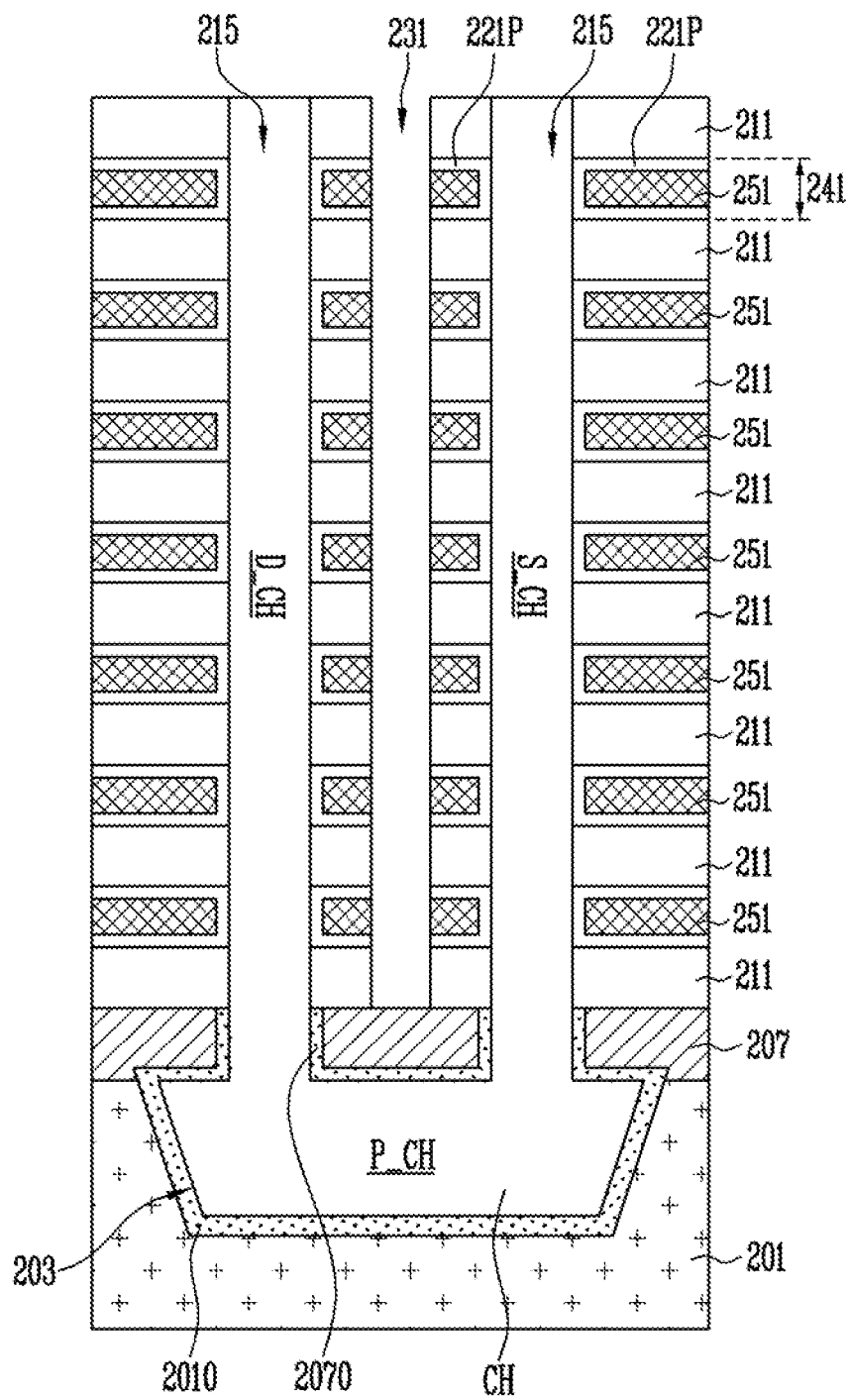

FIGS. 6A to 6C are cross-sectional views of various stages of a method for manufacturing the semiconductor device shown in FIG. 3B.

Using the same process as described above with connection to FIGS. 5A to 5D, the structure of FIG. 6A may be formed. More specifically the structure may include a first sub-pipe gate 201 having embedded therein a pipe hole 203; a first oxidized layer 201O formed within a portion of the first sub-pipe gate 201 adjacent to the pipe hole 203; a second sub-pipe gate 207 disposed on the first sub-pipe gate 201 covering the pipe hole 203; and vertical holes 215 passing through the second sub-pipe gate 207; a second oxidized layer 207O formed within a portion of the second sub-pipe gate 207 adjacent to the vertical holes 205 and the pipe hole 203, the second oxidized layer 207O having a smaller thickness than that of the first oxidized layer 201O; vertically alternating layers of first material layers 211 and second material layers on top of the second sub-pipe gate 207, the vertically alternating layers being vertically passed through by the vertical holes 215. Each of the second material layers may include each of third oxidized layers 213O facing the vertical holes 215, and each of non-oxidized layers 213NO.

Thereafter, a channel layer CH may be formed in a channel hole including a connection of the vertical holes 215 and the pipe hole 203. The channel layer CH may be formed of a semiconductor layer such as silicon. The channel layer CH may have a tube form, a solid rod form or a combination thereof as described with reference to FIG. 2. The channel layer CH may include a pipe channel layer P_CH formed in the pipe hole 203, and drain and side channel layers D_CH and S_CH formed in the respective vertical holes 215. The channel layer CH may be surrounded with the first to third oxidized layers 201O, 207O, 213O and the first material layers 211.

Referring to FIG. 6B, after forming the channel layer CH, a slit 231 may be formed by vertically partially etching the non-oxidized layers (213NO in FIG. 6A) of the second and first material layers 211 between the vertical holes 215, in other words, between the source side channel layer S_CH and the drain side channel layer D_CH. The slit 231 may pass through and expose partially the non-oxidized layers (213NO in FIG. 6A) of the second material layers and the first material layers 211. The non-oxidized layers (213NO in FIG. 6A) exposed through the slit 231 may be removed through the slit 231 to form openings 241. The openings 241 may expose the third oxidized layers (213O in FIG. 6A). During etching the non-oxidized layers (213NO in FIG. 6A) of the second material layers, the third oxidized layers 213O may act as an etching stop layer to protect the source side channel layer S_CH and the drain side channel layer D_CH from the etching.

After this, the third oxidized layers 213O may be removed through the slit 231. As a result, widths of the openings 241 may broaden. Next, a multi-layered structure 221 may be formed along inner faces of the openings 241 and the slit 231. The multi-layered structure 221 may include a blocking insulating layer, a data storage layer and a tunnel insulating layer in this order starting from an inner face of the channel hole, as shown in FIG. 4.

Referring to FIG. 6C, etch barrier patterns (not shown) may respectively fill the openings 241, and the multi-layered structure 221 formed along the inner face of the slit 231 may be partially removed so that the multi-layered structure 221 may be divided into multiple patterns 221P. Each of the multiple patterns 221P may have a C shaped cross-section.

Then, the etch barrier patterns (not shown) may be removed to expose the multiple patterns 221P. Each of the multiple patterns 221P may be formed along an inner surface of each opening 241. Thereafter, the openings 241 may be respectively filled with conductive patterns 251.

In this way, by the process as described above with connection to FIG. 6A to FIG. 6C, the semiconductor device as shown in FIG. 3B may be formed.

FIGS. 7A to 7D are cross-sectional views of various stages of a method for manufacturing the semiconductor device shown in FIG. 3C.

Using the same process as described above with connection to FIGS. 5A to 5D, a structure may be formed. More specifically, the structure may include a first sub-pipe gate 301 having embedded therein a pipe hole 303; a first oxidized layer 301O formed within a portion of the first sub-pipe gate 301 adjacent to the pipe hole 303; a second sub-pipe gate 307 disposed on top of the first sub-pipe gate 301 to cover the pipe hole 303 and vertically passed-through by vertical holes 315; a second oxidized layer 307O formed within a portion of the second sub-pipe gate 307 adjacent to the vertical holes 315 and the pipe hole 303, the second oxidized layer 307O having a smaller thickness than that of the first oxidized layer 301O; vertically alternating layers of first material layers 311 and second material layers on top of the second sub-pipe gate 207, the vertically alternating layers being vertically passed through by the vertical holes 315. Each of the second material layers may include each of third oxidized layers 313O facing the vertical holes 315, and each of non-oxidized layers 313NO.

Thereafter, a multi-layered structure 321 may be formed along an inner face of a channel hole including a connection of the vertical holes 315 and the pipe hole 303. The multi-layered structure 321 may include a blocking insulating layer 321a, a data storage layer 321b and a tunnel insulating layer 321 in this order from the inner face of the channel hole. The multi-layered structure 321 may be formed to conform to the inner face of the channel hole. The multi-layered structure 321 may be surrounded with the first to third oxidized layers 301O, 307O, 313O and the first material layers 311. The data storage layer 321b may have a third thickness DD3.

A channel layer CH may then be formed in the channel hole including a connection of the vertical holes 315 and the pipe hole 303. The channel layer CH may be formed of a semiconductor layer such as silicon. The channel layer CH may have a tube form, a solid rod form or a combination thereof as described with reference to FIG. 2. The channel layer CH may include a pipe channel layer P_CH formed in the pipe hole 303, and a drain side channel layer D_CH and a source side channel layer S_CH formed respectively in the vertical holes 315.

Figure 7B:
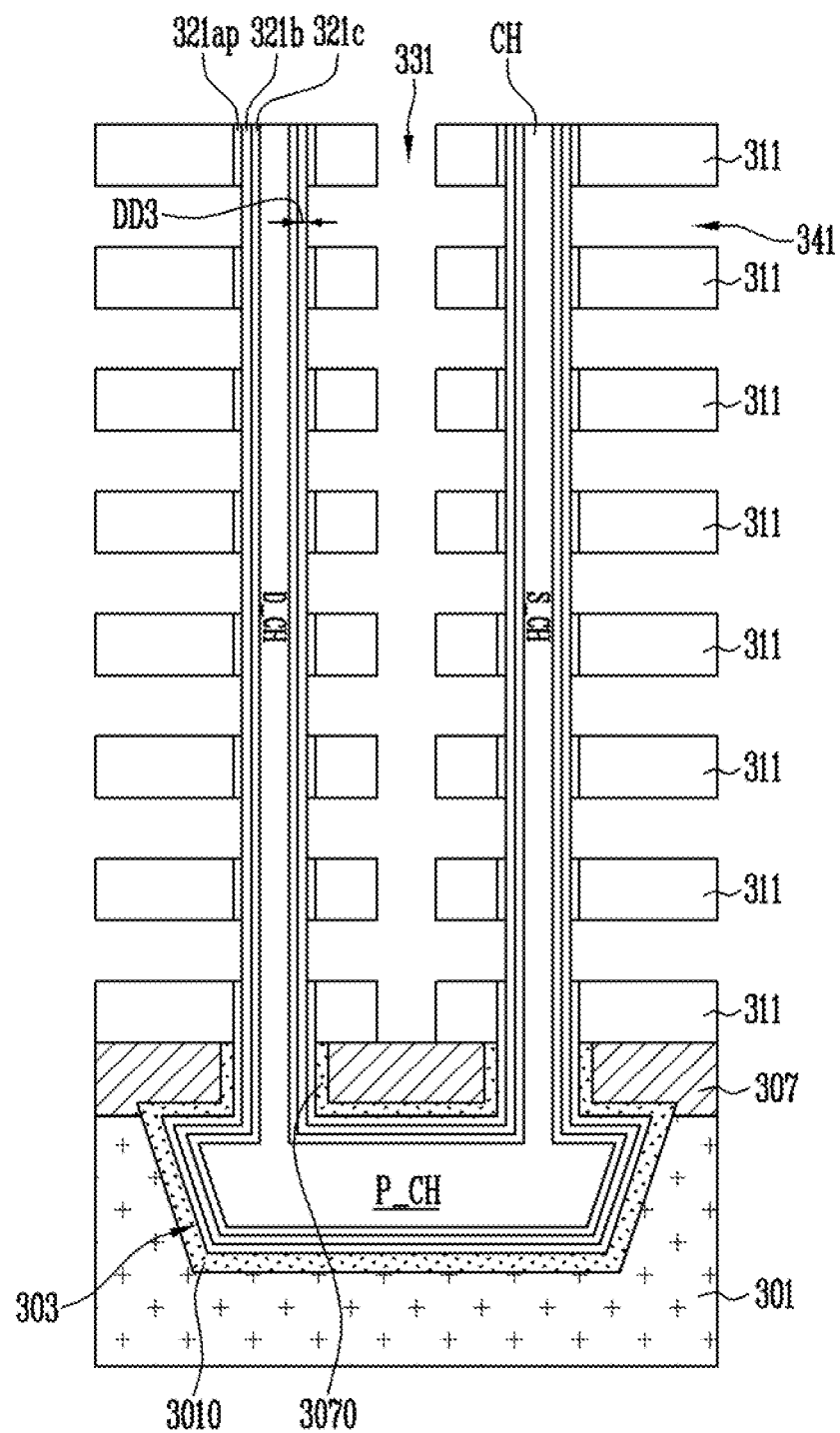

Referring to FIG. 7B, a slit 331 may be formed by partially etching in a vertical direction the non-oxidized layers (313NO in FIG. 7A) of the second material layers and the first material layers 311 between the source side channel layer S_CH and the drain side channel layer D_CH. The slit 331 may pass through and expose partially the non-oxidized layers (313NO in FIG. 7A) of the second material layers and the first material layers 311. The non-oxidized layers (313NO in FIG. 7A) exposed through the slit 331 may be removed and then the third oxidized layers (313O in FIG. 7A) may be removed through the slit 331 to form openings 341. During etching the non-oxidized layers (313NO in FIG. 7A) of the second material layers, the third oxidized layers 313O may act as an etching stop layer to protect the multi-layered structure (321 in FIG. 7A) from the etching.

By removing the third oxidized layers 313O, the first blocking insulating layer may be partially exposed between the adjacent first material layers 311. After this, the exposed portions of the first blocking insulating layer between the first material layers 311 may be removed to divide the first blocking insulating layer into a multiple of first blocking insulating patterns 321ap, and, at the same time, to broaden widths of the openings 341. Further, the data storage layer 321b may be partially exposed through the openings 341.

Figure 7C:
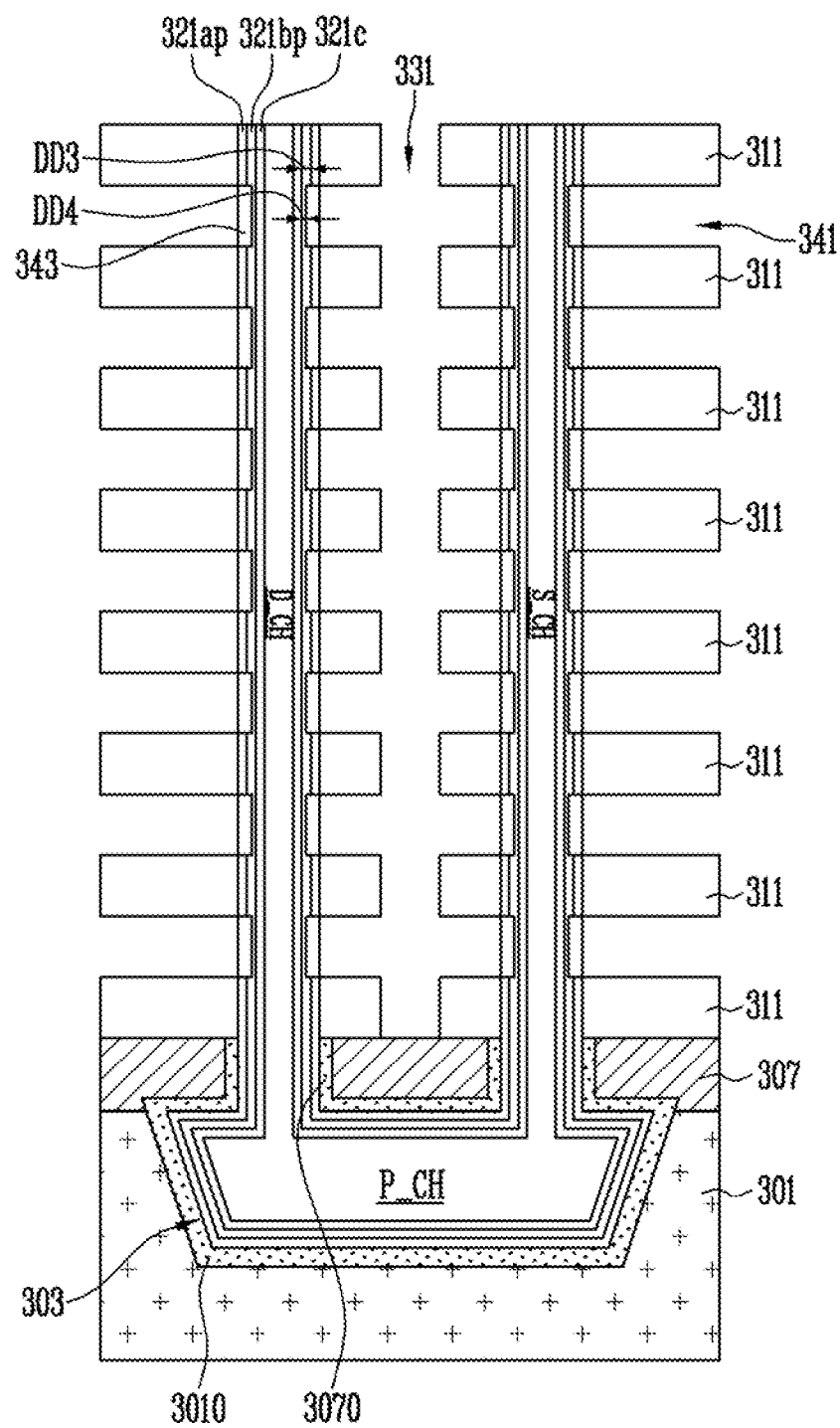

Referring to FIG. 7C, the exposed portions of the data storage layer through the openings 341 may be respectively oxidized to form a multiple of second blocking insulating layers 343. For example, each of main portions of the data storage layer contacting respectively the second blocking insulating layers 343 may remain having a fourth thickness DD4 smaller than the third thickness DD3, and each of dummy portions of the data storage layer contacting the first material layers 311 may remain with the third thickness DD3. In other words, a remaining data storage layer 321bp after forming the second blocking insulating layers 343 may include the dummy portions, each dummy portion having the third thickness DD3, and the main portions, each main portion having the fourth thickness DD4. Further, the remaining data storage layer 321bp may include recesses formed therein, each recess being filled with each second blocking insulating layer 343.

Each of the second blocking insulating layers 343 may include a first portion and a second portion. The first portion may be an oxidized portion resulting from an oxidation of a portion of data storage layer, and the second portion may grow the first portion.

Figure 7D:
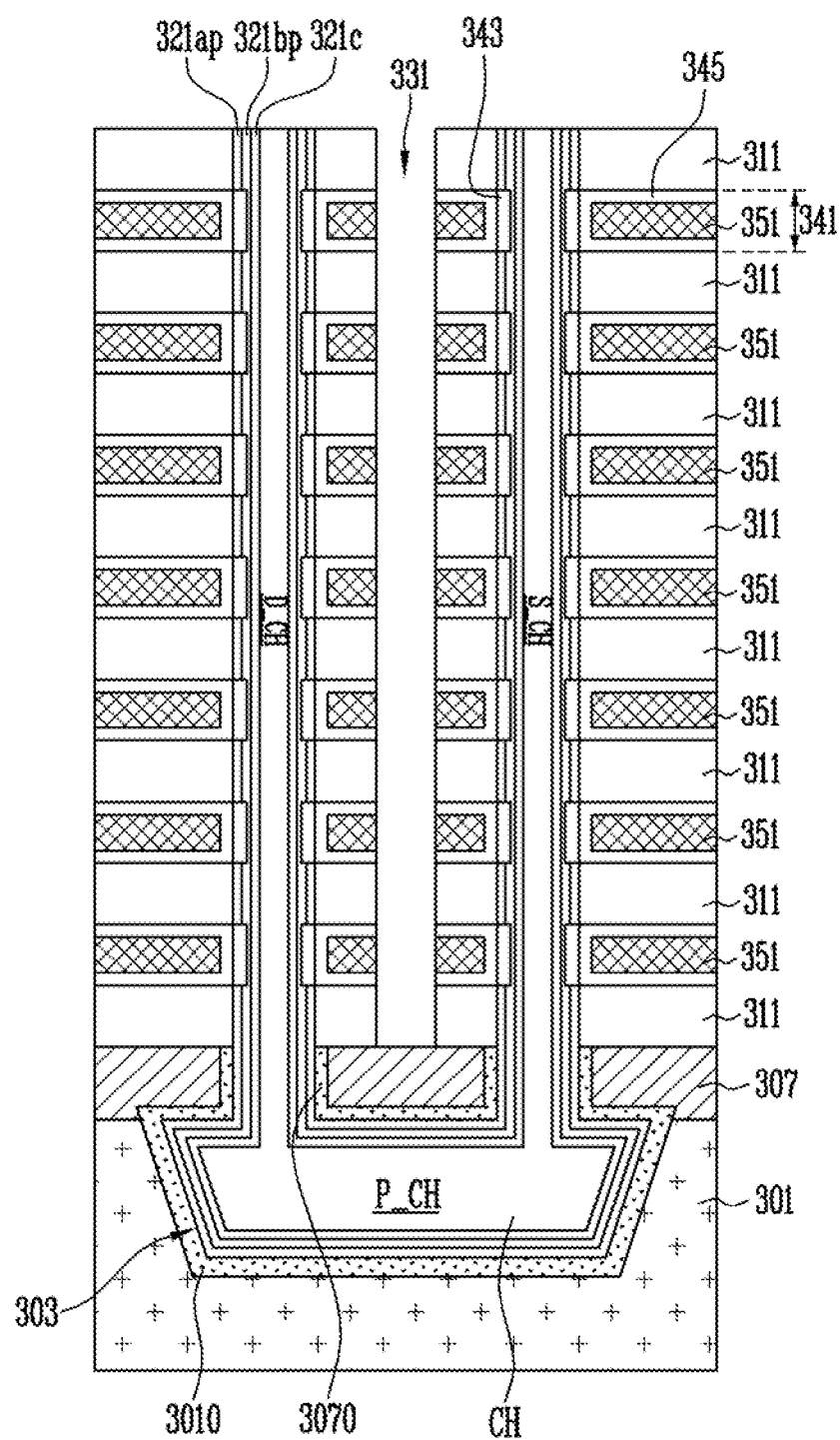

Referring FIG. 7D, after forming the second blocking insulating layers 343, third blocking insulating layers 345 may be formed along inner faces of the openings 341 and the slit 331. Each of the third blocking insulating layers 345 may include $Al_2O_3$. Thereafter, each of conductive patterns 351 may be formed on each of the third blocking insulating layers 345 to fill each of the openings 341.

In this way, by the process as described above with connection to FIG. 7A to FIG. 7D, the semiconductor device as shown in FIG. 3C may be formed.

In the present disclosure, the pipe gate may include a stack of the first and second sub-pipe gates formed of materials having different oxidation rates so that the first sub-pipe gate may have a higher oxidation rate than that of the second sub-pipe gate. Thus, the first oxidized layer resulting from the oxidation of a portion of the first sub-pipe gate may have a larger thickness, and, hence, in a program operation, the pipe gate may be supplied with a sufficiently high level of a pass voltage. This may reduce disturbance of a pipe transistor, and may decrease a threshold voltage shift of the pipe transistor.

Further, in the present disclosure, due to the oxidation rate of the second sub-pipe gate passed-through by the vertical holes being lower than that of the first sub-pipe gate, the second oxidized layer resulting from the oxidation of a portion of the second sub-pipe gate may have a relatively smaller thickness. This may prevent the widths of the vertical holes from being overly narrow, which may otherwise be very narrow by a larger thickness of the second oxidized layer therein.

Figure 8:
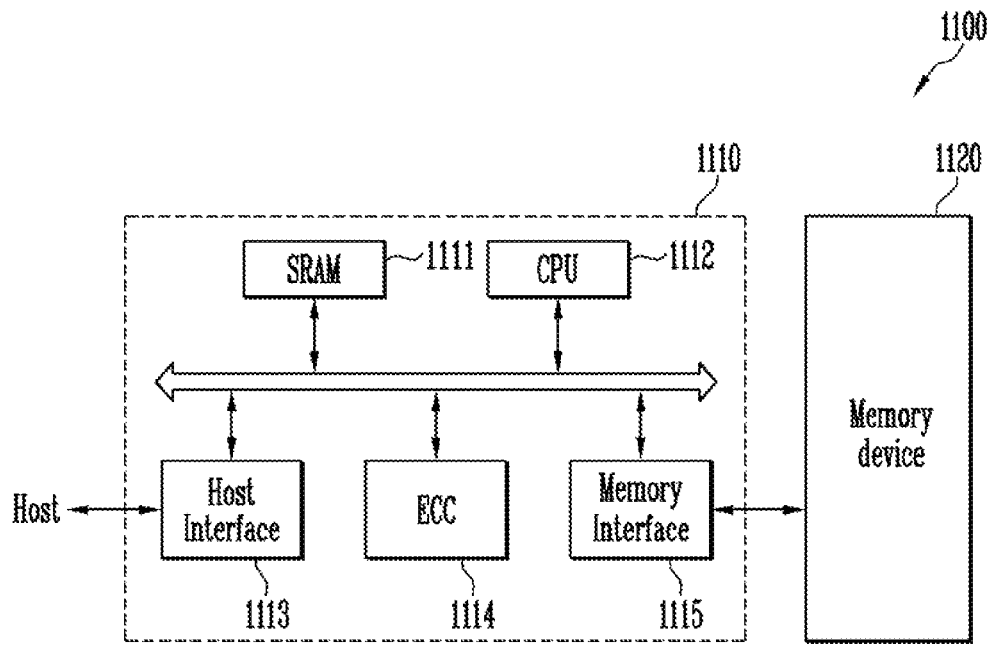
FIG. 8 is a block diagram of a memory system, according to an embodiment of the present disclosure.

Referring to FIG. 8 a memory system 1100 is provided, according to an embodiment of the present disclosure. The memory system 1100 may include a semiconductor memory device 1120 and a memory controller 1110.

The semiconductor memory device 1120 may be configured as illustrated above in connection to FIGS. 3A to 7D. In an embodiment, the semiconductor device 1120 may comprise a first sub-pipe gate having a pipe hole formed therein; a second sub-pipe gate disposed on the first sub-pipe gate; vertical holes coupled to the pipe hole and passing-through the second sub-pipe gate, wherein a material of the second sub-pipe gate has a lower oxidation rate than that of a material of the first sub-pipe gate; a first oxidized layer formed within a portion of the first sub-pipe gate along a contour of the pipe hole; and a second oxidized layer formed within a portion of the second sub-pipe gate along contours of the vertical holes and the contour of the pipe hole.

The memory device 1120 may be implemented as a multi-chip package including a plurality of flash memory chips.

The memory controller 1110 may be configured to control the memory device 1120. The memory controller may include a static random access memory (SRAM) 1111, a central processing unit (CPU) 1112, a host interface 1113, an error correction code (ECC) unit 1114, and a memory interface 1115. The SRAM 1111 may act as a work memory for the CPU 1112. The CPU 1112 may control all operations for data exchange of the memory controller 1110. The host interface 1113 may have a data exchange protocol between the memory system 1100 and a host system (not shown) coupled to the memory system 1100. Further, the ECC unit 1114 may detect and correct an error in data read from the memory device 1120, and the memory interface 1115 may interface the memory device 1120. The memory controller 1110 may further include a read only memory (ROM) for storing code data to interface the host system.

The memory system 1100 may be implemented in a memory card or a solid state disk (SSD) as a combination of the memory device 1120 and the memory controller 1110. In one example, when the memory system 1100 is implemented as the SSD, the memory controller 1110 may communicate having an external device (e.g., host system) via various interface protocols such as USB, MMC, PCI-E, SATA, PATA, SCSI, ESDI, IDE, and or the like.

Figure 9:
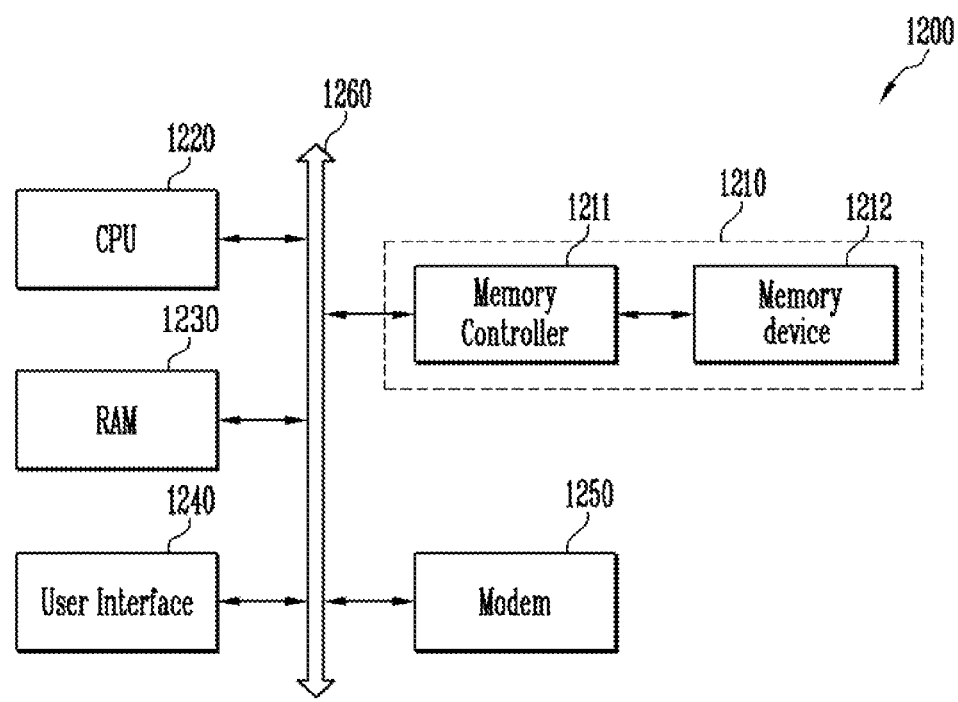
FIG. 9 is a configuration diagram of a computing system, according to an embodiment of the present disclosure.

FIG. 9 illustrates a computing system 1200 according to an embodiment of the present disclosure.

Referring to FIG. 9 the computing system 1200 may include a central processing unit (CPU) 1220, a random access memory (RAM) 1230, a user interface 1240, a modem 1250, and a memory system 1210, all of which are electrically connected to each other via a system bus 1260. Further, when the computing system 1200 is implemented in a mobile device, the computing system 1200 may be further provided having a battery (not shown) to supply an operation voltage thereof, and may be further provided having an application chipset, camera image processor (CIS), mobile DRAM, and or the like.

The memory system 1210 may include the memory device 1212, as above-mentioned in FIG. 8, and the memory controller 1211.

The above description is not to be taken in a limiting sense, but is made merely for the purpose of describing the general principles of exemplary embodiments. It is noted that many additional embodiments and or variations thereof of the invention may be envisaged by those skilled in the relevant art without departing from the spirit and or scope of the invention as defined with reference to the following claims. Moreover, reference throughout this specification to "an embodiment," or similar language means that a particular feature, structure, or characteristic that is described in connection with the embodiment is included in at least one embodiment of the present disclosure. Thus, appearances of the phrases "in an embodiment," and similar language throughout this specification may, but do not necessarily, all refer to the same embodiment.

What is claimed is:

1. A semiconductor device comprising:
   a first sub-pipe gate comprising a conductive material and having a pipe hole formed therein;
   a second sub-pipe gate comprising a conductive material, the second sub-pipe gate disposed on the first sub-pipe gate and passed-through by vertical holes being coupled to the pipe hole, wherein the conductive material of the second sub-pipe gate has a lower oxidation rate than that of the conductive material of the first sub-pipe gate;
   a first oxidized layer formed within a portion of the first sub-pipe gate to conform to a contour of the pipe hole; and
   a second oxidized layer formed within a portion of the second sub-pipe gate to conform to a contour of the vertical holes and the contour of the pipe hole.

2. The device of claim 1, wherein the first and second sub-pipe gates are formed of poly-silicon materials having different silicon concentrations.

3. The device of claim 2, wherein the poly-silicon material of the first sub-pipe gate has a higher silicon concentration than the poly-silicon material of the second sub-pipe gate.

4. The device of claim 1, wherein the first oxidized layer has a larger thickness than the second oxidized layer.

5. The device of claim 1, further comprising:
   a stack of vertically alternating layers of interlayer insulating layers and conductive patterns on top of the second sub-pipe gate, the stack being passed through by the vertical holes;
   a slit passing through the stack between the vertical holes, the slit dividing the stack into a source side stack and a drain side stack; and
   a channel layer formed in and along the pipe hole and the vertical holes.

6. The device of claim 5, further comprising a multi-layered structure including a tunnel insulating layer surrounding the channel layer, a data storage layer surrounding the tunnel insulating layer, and a blocking insulating layer surrounding the data storage layer.

7. The device of claim 6, wherein the multi-layered structure extends along surfaces of the vertical holes and the pipe hole to surround an outer wall of the channel layer.

8. The device of claim 7, wherein the blocking insulating layer includes $Al_2O_3$.

9. The device of claim 6, wherein the multi-layered structure extends along a surface of each of the conductive patterns to have a C shape form.

10. The device of claim 5, further comprising:
   a tunnel insulating layer surrounding the channel layer;
   a data storage layer surrounding the tunnel insulating layer;
   a first blocking insulating layer surrounding the data storage layer, the first blocking insulating layer being formed between the interlayer insulating layers and the channel layer or between the first and second sub-pipe gates and the channel layer;
   a second blocking insulating layer surrounding the data storage layer, the second blocking insulating layer being formed between the conductive patterns and the channel layer; and
   a third blocking insulating layer surrounding the conductive patterns, the third blocking insulating layer being formed between the second blocking insulating layers and the conductive patterns,
   wherein the third blocking insulating layer is formed of an insulating material having a larger dielectric constant than the first and second blocking insulating layers.

* * * * *